United States Patent
Chen et al.

(10) Patent No.: US 12,218,277 B2
(45) Date of Patent: Feb. 4, 2025

(54) FLIP-CHIP LIGHT-EMITTING DIODE

(71) Applicant: XIAMEN SAN'AN OPTOELECTRONICS CO., LTD., Xiamen (CN)

(72) Inventors: Sihe Chen, Xiamen (CN); Yu-Chieh Huang, Xiamen (CN); Yashu Zang, Xiamen (CN); Tao Han, Xiamen (CN); Chunhsien Lee, Xiamen (CN); Chimeng Lu, Xiamen (CN); Jianbin Chen, Xiamen (CN)

(73) Assignee: XIAMEN SAN'AN OPTOELECTRONICS CO., LTD., Fujian (CN)

( * ) Notice: Subject to any disclaimer, the term of this patent is extended or adjusted under 35 U.S.C. 154(b) by 455 days.

(21) Appl. No.: 17/662,932

(22) Filed: May 11, 2022

(65) Prior Publication Data
US 2023/0067481 A1    Mar. 2, 2023

(30) Foreign Application Priority Data

Aug. 24, 2021   (CN) .......................... 202110977427.7

(51) Int. Cl.
*H01L 33/24* (2010.01)
*H01L 33/38* (2010.01)
*H01L 33/32* (2010.01)

(52) U.S. Cl.
CPC .............. *H01L 33/24* (2013.01); *H01L 33/38* (2013.01); *H01L 33/32* (2013.01)

(58) Field of Classification Search
None
See application file for complete search history.

(56) References Cited

U.S. PATENT DOCUMENTS

2018/0145228 A1*  5/2018  Chen .................... H01L 33/382
2023/0197904 A1*  6/2023  Chen ...................... H01L 33/62
                                                        257/98

* cited by examiner

*Primary Examiner* — Michelle Mandala
*Assistant Examiner* — Jordan M Klein
(74) *Attorney, Agent, or Firm* — Thomas|Horstemeyer, LLP

(57) ABSTRACT

A flip-chip light-emitting diode includes an epitaxial structure including a first semiconductor layer, an active layer and a second semiconductor layer that are sequentially disposed on one another in such order. The epitaxial structure is formed with first holes and second holes respectively at a first region and a second region that are independent from each other. Each of the first and second holes extends through the second semiconductor layer and the active layer, and partially exposes the first semiconductor layer. A surface of the first semiconductor layer exposed by the first holes has a total area smaller than a total area of a surface of the first semiconductor layer exposed by the second holes.

20 Claims, 26 Drawing Sheets

FLIP-CHIP LIGHT-EMITTING DIODE

CROSS-REFERENCE TO RELATED APPLICATION

This application claims priority of Chinese Invention Patent Application No. 202110977427.7, filed on Aug. 24, 2021.

FIELD

The disclosure relates to a semiconductor device, and more particularly to a flip-chip light-emitting diode, and a manufacturing method thereof.

BACKGROUND

Light-emitting diode (LED) is a semiconductor device that emits light energy generated by recombination of charge carriers. Among different types of LEDs, a flip-chip LED has advantageous properties such as a high light-emitting efficiency, a high heat dissipation ability, and without requiring wire bonding, and therefore is widely applied in different aspects.

As the flip-chip LED is capable of withstanding a relatively high current, the applications thereof have been extended from conventional lighting to railway transportations. However, there is still a need to improve the P/N structure in the flip-chip LED so as to prolong the service life of the flip-chip LED. In the conventional P/N structure, an n-electrode is connected to an n-type GaN layer through a plurality of vias. When a high current is applied to such P/N structurer current tends to flow through a shortest path, that is, electrons tend to accumulate at a region near the n-electrode, rather than spreading to a region distal to the n-electrode (longer path). This would result in localized heat generated at the region near the n-electrode, which might adversely affect reflectance of a reflecting structure in the LED, causing undesirable reduced light-emitting performance of the LED.

U.S. Pat. No. 9,412,907 B1 discloses a vertical LED structure that has non-uniform via structures which are used to regulate current flow and current crowding in order to improve light-emitting efficiency and uniformity of the LED.

SUMMARY

Therefore, an object of the disclosure is to provide a flip-chip light-emitting diode (LED) that can alleviate at least one of the drawbacks of the prior art.

In one aspect, the flip-chip LED includes an epitaxial structure, a first pad electrode and a second pad electrode. The epitaxial structure includes a first semiconductor layer, an active layer and a second semiconductor layer that are sequentially disposed on one another in such order. The epitaxial structure has a first region and a second region that are independent from each other. The epitaxial structure is formed with a plurality of first holes at the first region and a plurality of second holes at the second region. Each of the first and second holes extends through the second semiconductor layer and the active layer, and terminates at and partially exposes the first semiconductor layer. The first pad electrode is disposed on the first region, and is electrically connected to the first semiconductor layer. The second pad electrode is disposed on the second region, and is electrically connected to the second semiconductor layer. A surface of the first semiconductor layer exposed by the first holes has a total area which is smaller than a total area of a surface of the first semiconductor layer exposed by the second holes.

In another aspect, the flip chip LED includes an epitaxial structure, a first insulating layer, a connecting electrode, a first pad electrode and a second pad electrode. The epitaxial structure includes a first semiconductor layer, an active layer and a second semiconductor layer that are sequentially disposed on one another in such order. The epitaxial structure has a first region and a second region that are independent from each other. The first insulating layer is disposed on the epitaxial structure, and has a plurality of first openings that expose a portion of the first semiconductor layer at the first and second regions. The connecting electrode is disposed on the first insulating layer and within the first openings, and is electrically connected to the first semiconductor layer through the first opening. The first pad electrode is disposed on the first region, and is electrically connected to the first semiconductor layer through the connecting electrode. The second pad electrode is disposed on the second region, and is electrically connected to the second semiconductor layer. A contact area between the connecting electrode and the first semiconductor layer located at the first region is smaller than a contact area between the connecting electrode and the first semiconductor layer located at the second region.

BRIEF DESCRIPTION OF THE DRAWINGS

Other features and advantages of the disclosure will become apparent in the following detailed description of the embodiments with reference to the accompanying drawings, of which:

FIGS. 3 to 10B are schematic views illustrating consecutive steps of a method for preparing the first embodiment of the flip-chip LED according to the disclosure, in which FIGS. 4B, 5B, 6C, 7C, 8B, 9B and 10B are sectional views respectively taken along line A-A' shown in FIGS. 4A, 5A, 6A, 7A, 8A, 9A and 10A.

DETAILED DESCRIPTION

Figure 1A:
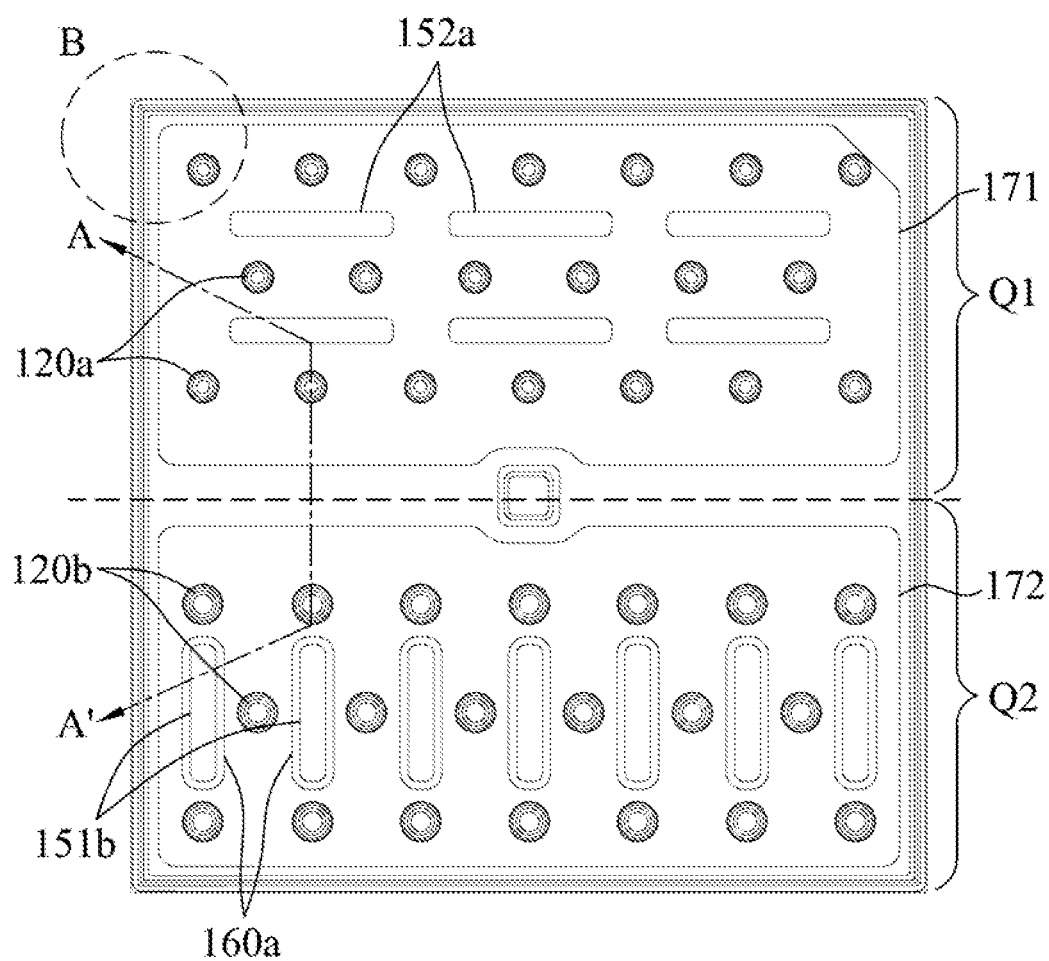
FIG. 1A is a schematic top view illustrating a first embodiment of a flip-chip light-emitting diode (LED) according to the disclosure.
Figure 1B:
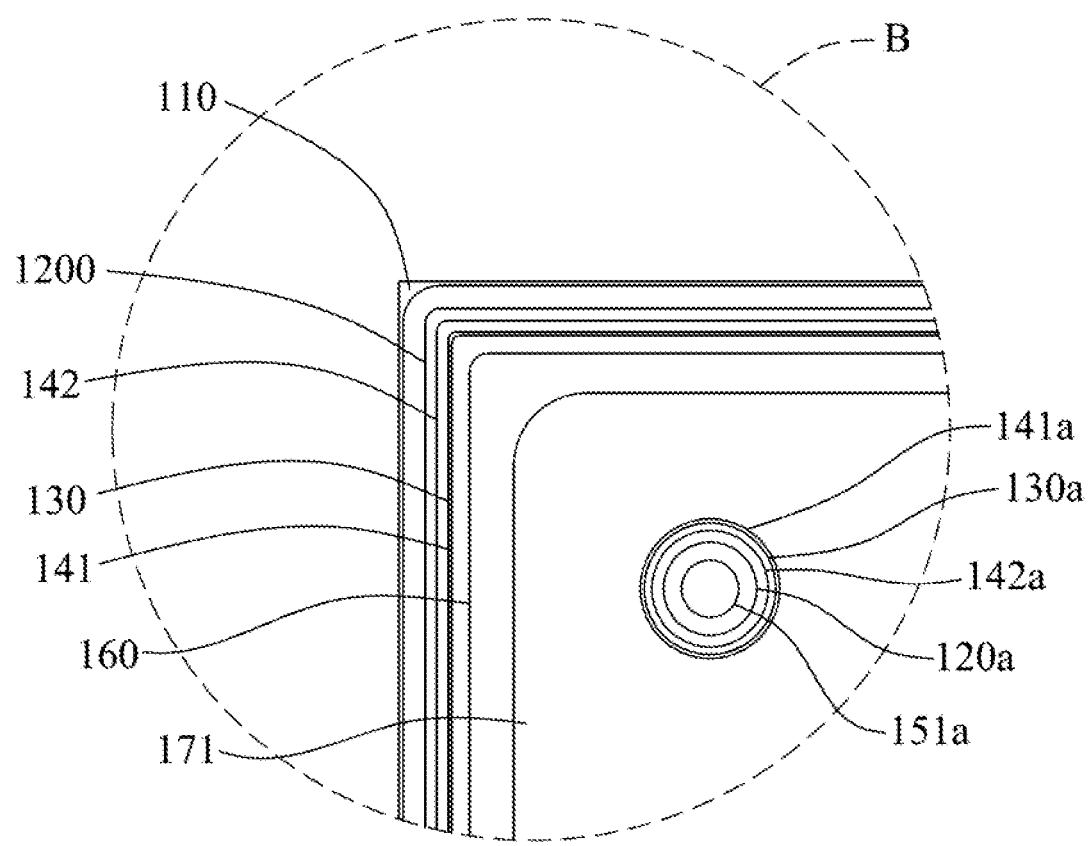
FIG. 1B is a partially enlarged schematic view of a circle region B shown in FIG. 1A.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1A, 1B, 2A and 2B, the first embodiment of the flip-chip light-emitting diode (LED) according of the disclosure includes a substrate 110, an epitaxial structure 120, a transparent conductive layer 130, a metallic layer 140, a first insulating layer 151, a second insulating layer 152, a connecting electrode 160, a first pad electrode 171 and a second pad electrode 172.

The substrate 110 may be made from a material that is suitable for growth of a semiconductor material. The material for making the substrate 110 may have an excellent heat conductivity. The substrate 110 may be an electrically conductive substrate or an insulating substrate. In addition, the substrate 110 may be made from a light-transmissible substrate. The substrate 110 may have a mechanical strength sufficient to prevent bowing of the epitaxial structure 120 formed thereon, and to enable dicing and singulation of a wafer of the flip-chip LED. Examples of the substrate 110 may include, but are not limited to, a sapphire ($Al_2O_3$) substrate, a silicon carbide (SiC) substrate, a silicon (Si) substrate, a zinc oxide (ZnO) substrate, a gallium nitride (GaN) substrate, a gallium arsenide (GaAs) substrate, and a gallium phosphide (GaP) substrate. In this embodiment, the substrate 110 is a sapphire substrate formed with a plurality of protrusions. The protrusions may have various slopes formed by dry etching, or may have predetermined slope(s) formed by wet etching.

The epitaxial structure 120 includes a first semiconductor layer 121, an active layer 122 and a second semiconductor layer 123 that are sequentially disposed on a substrate surface 1101 of the substrate 110 in such order. The first and second semiconductor layers 121, 123 may have different conductivity. For instance, the first semiconductor layer 121 may be an n-type semiconductor layer, and the second semiconductor layer 123 may be a p-type semiconductor layer, or vice versa.

The epitaxial structure 120 may be made of a group III-V based material, such as GaN, AlN, InGaN, AlGaN, InAlGaN, or combinations thereof. In this embodiment, the first semiconductor layer 121 is an n-type semiconductor layer for providing electrons, and is doped with an n-dopant such as Si, Ge, Se, Te, and C. The second semiconductor layer 123 is a p-type semiconductor layer for providing holes, and is doped with a p-dopant such as Mg, Zn, Be, Ca, Sr, and Ba.

Each of the first and second semiconductor layers 121, 123 may have a single-layer structure, or a multi-layered structure that includes sublayers having different compositions and/or different thickness. For instance, each of the first and second semiconductor layers 121, 123 may include a carrier injection sublayer to improve injection efficiency of a corresponding type of carriers. Each of the first and second semiconductor layers 121, 123 may include a superlattice structure.

The first semiconductor layer 121 may further include a current spreading sublayer (not shown in figures) proximal to the active layer 122. The current spreading sublayer may have a laminated configuration that includes a plurality of $Al_xIn_yGa_{1-x-y}N$ layers each having different x and y values (x ranging from 0 to 1, y ranging from 0 to 1), and/or doping concentrations. In certain embodiments, the current spreading sublayer may include an insulating material.

The second semiconductor layer 123 may include an electron blocking sublayer (not shown in figures) proximal to the active layer 122. The electron blocking sublayer may have a laminated configuration that includes at least one $Al_bGa_{1-b}N$ layer, or a plurality of $Al_aIn_bGa_{1-a-b}N$ layers having different compositions (a ranging from 0 to 1, b ranging from 0 to 1). The second semiconductor layer 123 may have a band gap larger than that of the active layer 122 so as to avoid passage of electrons through the second semiconductor layer 123.

The active layer 122 is configured to allow recombination of electrons and holes from the first and second semiconductor layers 121, 123 so as to emit light. The active layer 122 may have a single quantum well structure or a multiple quantum well structure including well layers and barrier layers stacked alternately. The well layers and the barrier layers may be made from a Group III-V semiconductor material, such as InGaN/GaN, InGaN/InGaN, GaN/AlGaN, InAlGaN/GaN, GaAs (InGaAs)/AlGaAs or GaP (InGaP)/AlGaP, but are not limited thereto. The well layer may have a band gap smaller than that of the barrier layer. Depending on the material for making the active layer 122, the flip-chip LED may emit a light with a predetermined wavelength. In this embodiment, the light emitted by the flip-chip LED has a wavelength ranging from 420 nm to 580 nm.

The epitaxial structure 120 has a first region Q1 and a second region Q2 that are independent of each other. The epitaxial structure 120 is formed with a plurality of first holes 120a at the first region Q1 and a plurality of second holes 120b at the second region Q2. Each of the first and second holes 120a, 120b extends through the second semiconductor layer 123 and the active layer 122, and terminates at and partially exposes a surface 1211 of the first semiconductor layer 121. In this embodiment, each of the first and second holes 120a, 120b terminates within the first semiconductor layer 121 (i.e., a part of the first semiconductor layer 121 is etched). The surface 1211 of the first semiconductor layer 121 exposed by the first holes 120a has a total area which is smaller than a total area of the surface 1211 of the first semiconductor layer 121 exposed by the second holes 120b.

It is noted that when holes exposing the first semiconductor layer 121 are equally spaced apart from each other and have identical diameters in a conventional flip-chip LED, current transmission may be greatly affected upon application of a high level current. Specifically, current tends to flow towards the first semiconductor layer 121 through a shortest path (i.e., through holes that are near the first pad electrode 171), rather than to spread towards the first semiconductor layer 121 through the holes near the second pad electrode 172. This would result in a higher current density (i.e., current crowding effect) generated near the first pad electrode 171. Such higher current density may cause heat accumulation at the region near the first pad electrode 171, which might adversely affect reflectance of the metallic layer 140, causing undesirable reduced light-emitting performance of the LED and severe light decay during aging of the flip-chip LED. However, with a total area of the surface 1211 exposed by the first holes 120a being smaller than that exposed by the second holes 120b, it is beneficial to increase a flow of current towards the first semiconductor layer 121 through the second holes 120b at the second region Q2, thereby alleviating current crowding effect at the first region Q1. Therefore, a reduced reflectance of the metallic layer 140 (will be discussed later) caused by overheat may be greatly improved, and the problems regarding reduced light-emitting efficiency and light decay can be avoided.

In this embodiment, a diameter L1 of the first holes 120a adjacent to the first semiconductor layer 121 is smaller than a diameter L2 of the second holes 120b adjacent to the first semiconductor layer 121. Such configuration may be further conducive to increasing a flow of current towards the second holes 120b at the second region Q2.

Each of the first holes 120a and the second holes 120b is defined by a hole-defining wall having a cross section that may be parallel to the surface 1211 of the first semiconductor layer 121. The cross section of the hole-defining wall may be in a shape of circle, oval, rectangle, polygon or any arbitrary shape. The first holes 120a and/or the second holes 120b may be arranged into multiple rows. Any two adjacent rows of the first holes 120a, and/or any two adjacent rows of the second holes 120b may be aligned, or staggered with each other.

The transparent conductive layer 130 is disposed on the epitaxial structure 120 opposite to the substrate 110, and forms ohmic contact with the second semiconductor layer 123. The transparent conductive layer 130 may be in contact with a majority of, or even the entire upper surface of the second semiconductor layer 123, such that current can be horizontally and evenly spread throughout the second semiconductor layer 123.

The transparent conductive layer 130 may be made of ITO, InO, SnO, cadmium tin oxide (CTO), ATO, ZnO, GaP, or combinations thereof. The transparent conductive layer 130 may have a thickness ranging from 5 nm to 100 nm, such as 10 nm to 50 nm. The transparent conductive layer 130 may be formed by evaporation deposition or sputtering deposition.

The metallic layer 140 is disposed on the transparent conductive layer 130, and may have a single-layer structure or a multi-layered structure. The metallic layer 140 may be made from a conductive material that electrically contacts with the transparent conductive layer 130. For example, the metallic layer 140 may include a metallic material having a reflectance greater than 60%, such as gold (Au), tungsten (W), platinum (Pt), iridium (Ir), silver (Ag), aluminum (Al), copper (Cu), nickel (Ni), titanium (Ti), chromium (Cr), or an alloy thereof, or any combination thereof. Therefore, the current applied on the metallic layer 140 can effectively spread through the transparent conductive layer 130.

In certain embodiment, the metallic layer 140 has a multi-layered structure which may include a reflecting sublayer 141 and/or a blocking sublayer 142. In this embodiment, the reflecting sublayer 141 is disposed between the blocking sublayer 142 and the transparent conductive layer 130. A side wall 141a of the reflecting sublayer 141 may be located inward of, outward of, or flush with a side wall 130a of the transparent conductive layer 130. In this embodiment, the side wall 141a of the reflecting sublayer 141 is disposed inward of the side wall 130a of the transparent conductive layer 130. That is, a projection of the reflecting sublayer 141 on the epitaxial structure 120 is located within a projection of the transparent conductive layer 130 on the epitaxial structure 120, and the projection of the transparent conductive layer 130 has an area larger than that of the reflecting sublayer 141 so as to enlarge the contact area between the transparent conducting layer 130 and the epitaxial structure 120 for reducing voltage.

A side wall 142a of the blocking sublayer 142 may be located inward of, outward of, or flush with the side wall 141a of the reflecting sublayer 141. In this embodiment, the side wall 142a of the blocking sublayer 142 is disposed outward of and covers the side wall 141a of the reflecting sublayer 141 and the side wall 130a of the transparent conductive layer 130. That is, the projections of the transparent conductive layer 130 and the reflecting sublayer 141 on the substrate 110 are located within a projection of the blocking sublayer 142 on the substrate 110. With such configuration, the blocking sublayer 142 may provide enhanced adhesion to the reflecting sublayer 141 and the transparent conductive layer 130, and may prevent the reflecting sublayer 141 from being peeled off from the transparent conductive layer 130, in which such peeling may result in unevenness interface therebetween and damage due to electrostatic discharge (ESD). In addition, the blocking sublayer 142 covering the reflecting sublayer 141 also prevents undesirable reduction of reflectance of the reflecting sublayer 141 due to oxidation. Furthermore, the blocking sublayer 142 may protect the material of the reflecting sublayer 141 (such as Ag or Al) from being heated or diffused, so as to further enhance reflecting performance of the reflecting sublayer 141.

The blocking sublayer 142 may include a metallic material such as titanium (Ti), tungsten (W), aluminum (Al), indium (In), tin (Sn), nickel (Ni), platinum (Pt), or an alloy thereof. The blocking sublayer 142 may be formed as a laminated structure, such as Ti/Al, and/or Ti/W. In certain embodiments, the blocking sublayer 142 includes a laminated Ti/W structure proximal to the reflecting sublayer 141, and a laminated Ti/Al structure distal from the reflecting sublayer 141.

Figure 2A:
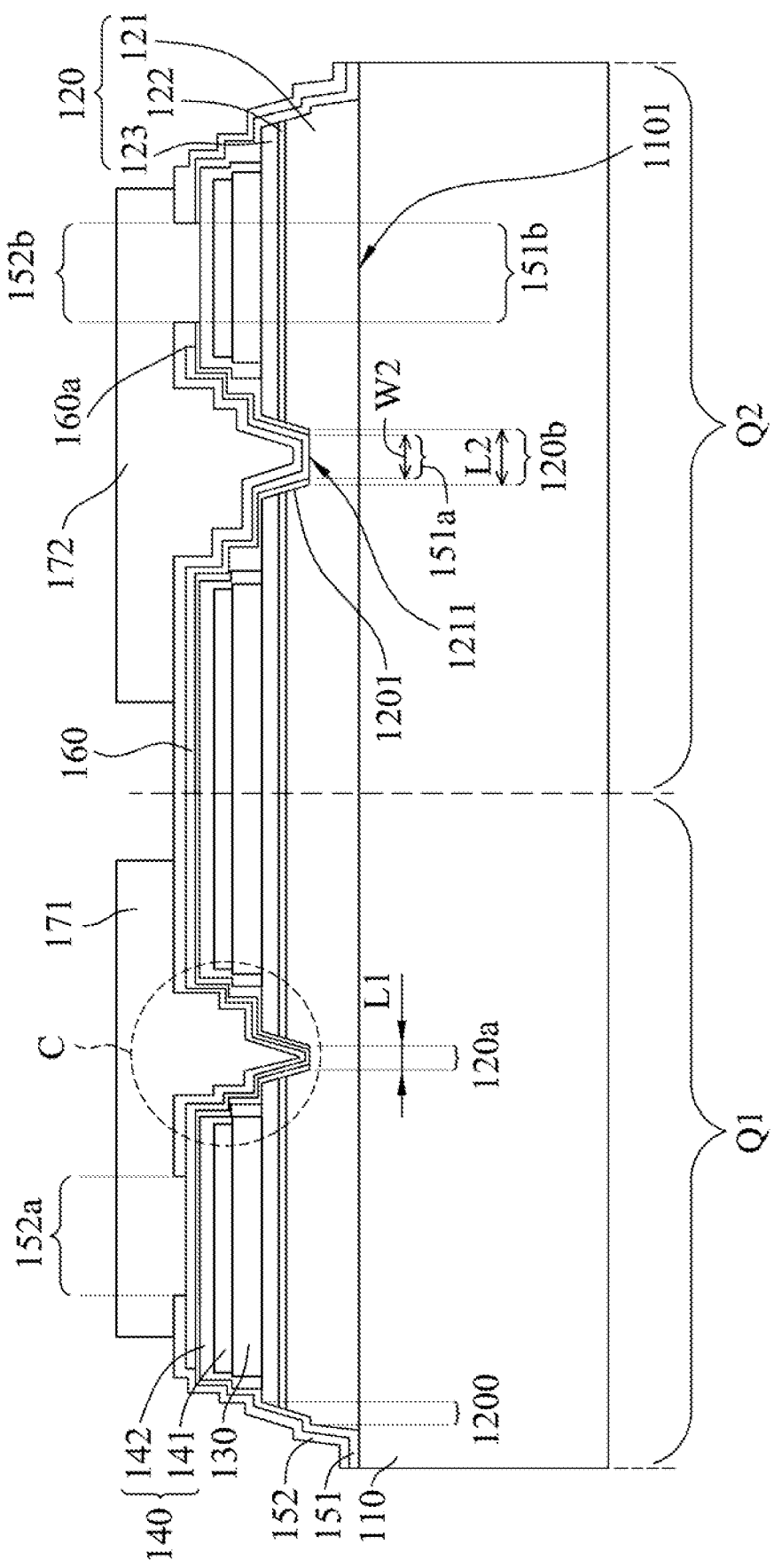
FIG. 2A is a schematic sectional view taken along line A-A' shown in FIG. 1A, illustrating the first embodiment of the flip-chip LED according to the disclosure.
Figure 2B:
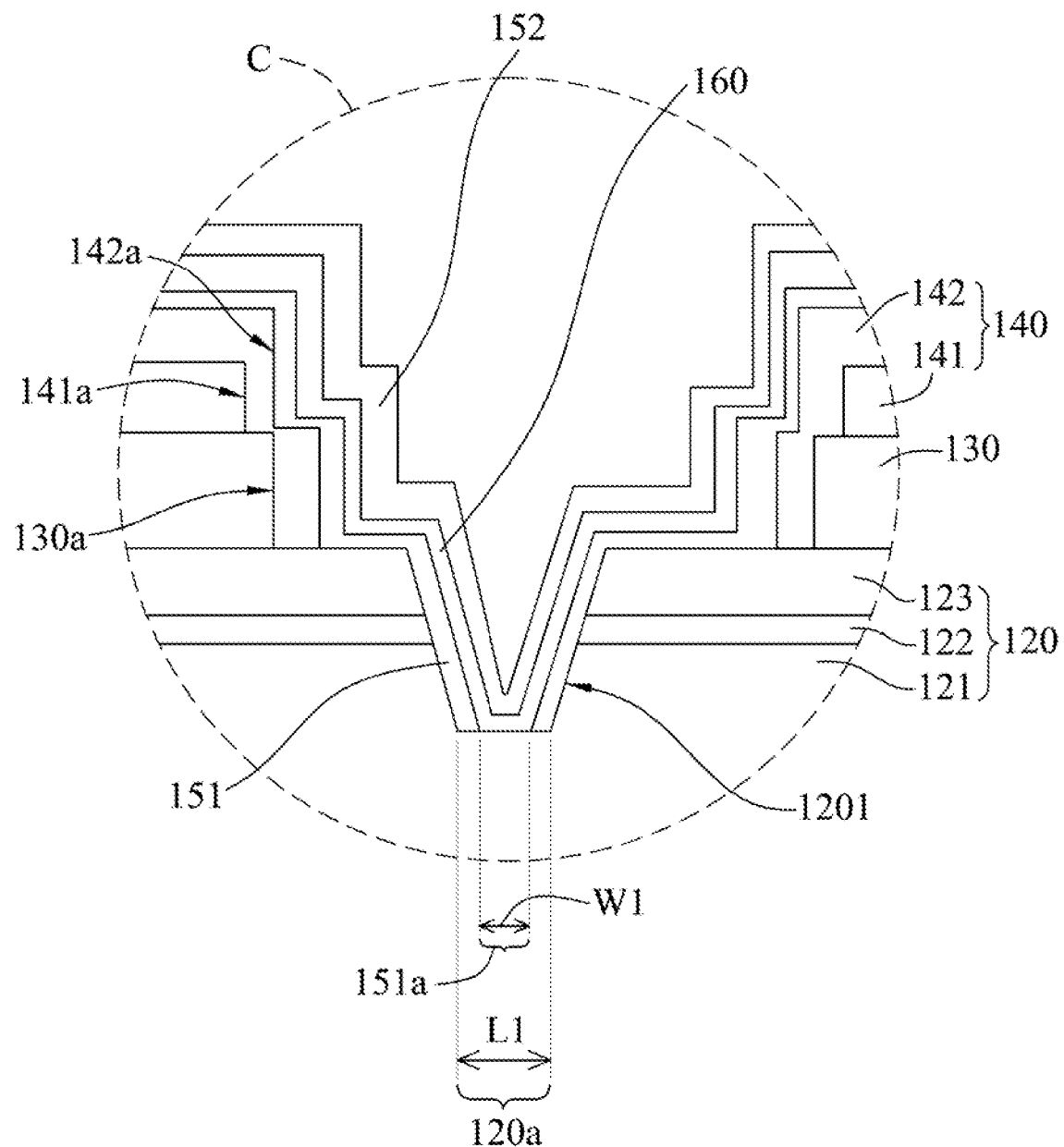
FIG. 2B is a partially enlarged view of a circle region C shown in FIG. 2A.

The first insulating layer 151 is conformally disposed on the epitaxial structure 120 and the metallic layer 140, i.e., covers lateral surface of both the epitaxial structure 120 and the metallic layer 140. The first insulating layer 151 is formed with a plurality of first openings 151a that partially expose the surface 1211 of the first semiconductor layer 121, and is formed with at least one second opening 151b that partially exposes the metallic layer 140 at the second region Q2. In this embodiment, the first insulating layer 151 has a plurality of the second openings 151b. The first openings 151a and the second openings 151b may have different shapes, different widths and/or different amounts. The first openings 151a are disposed at locations corresponding to the first and second holes 120a, 120b. Each of the first openings 151a may partially or entirely overlap with a corresponding one of the first and second holes 120a, 120b. In this embodiment, each of the first openings 151a is located within the corresponding one of the first and second holes 120a, 120b. In certain embodiments, the first openings 151a located at the first region Q1 have a width W1 that is smaller than a width W2 of the first openings 151a located at the second region Q2. In a case that the hole-defining walls of the first and second holes 120a, 120b have inclined surfaces (as shown in FIG. 2B), the first insulating layer 151 can be wore steadily formed thereon.

The first insulating layer 151 may have a single-layer structure or a multi-layered structure to protect the epitaxial structure 120. In a case the first insulating layer 151 has the multi-layered structure, a distributed Bragg reflector (DBR) may be formed to include at least two different layers which are alternately stacked on one another and which are respectively made of materials with different refraction indices, so as to selectively reflect light having specific wavelength.

The first insulating layer 151 may be made of a non-conductive material, for instance, an organic material such as SU-8 photoresist, benzocyclobutene (BCB), perfluorocyclobutane (PFCB), epoxy, acrylic resin, cyclic olefin copolymer (COC), poly(methyl methacrylate) (PMMA), polyethylene terephthalate (PET), polycarbonate (PC), polyetherimide, fluorocarbon polymer; an inorganic material such as silicone and glass; and an dielectric material such as $Al_2O_3$, $SiN_x$, $SiO_x$, $TiO_x$, and $MgF_x$.

The connecting electrode 160 is conformally disposed on the first insulating layer 151, and extends into the first openings 151a and covers the exposed surface 1211 of the first semiconductor layer 121 to electrically contact with the first semiconductor layer 121. The connecting electrode 160 is electrically insulated from the second semiconductor layer 123 through the first insulating layer 151.

In certain embodiments, the connecting electrode 160 forms ohmic contact with the first semiconductor layer 121. A contact area between the connecting electrode 160 and the first semiconductor layer 121 located at said first region Q1 is smaller than a contact area between the connecting electrode 160 and the first semiconductor layer 121 located at the second region Q2. With such configuration, current may be enforced to flow toward the first semiconductor layer 121 via the second holes 120b, and overheating of the epitaxial structure 120 at the first region Q1 may be alleviated, so as to avoid the problem regarding melting of the connecting electrode 160 due to overheat which may cause short circuit of the flip-chip LED, and/or the problem regarding cracking of the connecting electrode 160 which may result in poor electrical contact and an undesirably high voltage. In addition, such configuration may also further improve current spreading effect, so as to lower voltage of the flip-chip LED and to enhance light-emitting efficiency.

The connecting electrode 160 is etched to form at least one electrode opening 160a which corresponds in shape and number to the second opening 151b, and which exposes the metallic layer 140 at the second region Q2. In this embodiment, the connecting electrode 160 has a plurality of the electrode openings 160a. Each of the electrode openings 160a may partially or entirely overlap with a corresponding one of the second openings 151b. In this embodiment, each of the second openings 151b is surrounded by the corresponding one of the electrode openings 160a. That is, the electrode openings 160a may have a width greater than that of the second openings 151b. In certain embodiments, the electrode openings 160a may be in an annular shape (see FIG. 1A).

The connecting electrode 160 may have a single-layer structure, or a multi-layered structure. To lower contact resistance with the first semiconductor layer 121, the connecting electrode 160 may include a metallic material such as Cr, Ti, W, Au, Al, In, Sn, Ni, Pt, or an alloy thereof. In certain embodiments, the metallic material may include a metal with a high reflectance, such as Al or Pt. In other embodiments, the connecting electrode 160 may include Cr or Ti at a side that is in contact with the first semiconductor layer 121, so as to enhance adhesion to the first semiconductor layer 121.

The second insulating layer 152 is conformally disposed on and extends along the connecting electrode 160 and the first insulating layer 151. The second insulating layer 152 is formed with at least one third opening 152a that partially exposes the connecting electrode 160, and at least one fourth opening 152b that partially exposes the metallic layer 140. In this embodiment, the second insulating layer 152 has multiple third openings 152a and multiple fourth openings 152b. The third openings 152a are located at the first region Q1, and the fourth openings 152b are located at the second region Q2. The third openings 152a do not overlap with the first holes 120a, and the fourth openings 152b of the second insulating layer 152 do not overlap with the second holes 120b. Therefore, the third and fourth openings 152a, 152b would not overlap with the first openings 151a. Each of the fourth openings 152b is located at a position corresponding to and partially overlaps with a corresponding one of the second openings 151b. The fourth openings 152b may have a width that is identical to, or greater than a width of the second openings 151b. In this embodiment, the width of the fourth openings 152b is identical to that of the second openings 151b. In addition, each of the fourth openings 152b is located within a corresponding one of the electrode openings 160a (i.e., the width of the fourth openings 152b is smaller than that of the electrode openings 160a), so as to encapsulate the connecting electrode 160, thereby achieving electrical insulation of the connecting electrode 160 from the second pad electrode 172 (will be discussed later).

The second insulating layer 152 may include an insulating material, such as $SiO_2$, $SiN_x$, or $MgF_2$. The second insulating layer 152 may also be formed with a multilayer structure, such as a DBR structure having different layers including insulating materials with different refractive indices that are alternately stacked on one another, thereby improving light-emitting efficiency of the flip-chip LED.

The first pad electrode 171 and the second pad electrode 172 are disposed on the epitaxial structure 120, and partially cover the second insulating layer 152. The first and second pad electrodes 171, 172 are respectively disposed at the first region Q1 and the second region Q2 (i.e., they are separated from each other), and are respectively electrically connected to the first semiconductor layer 121 and the second semiconductor layer 123. In this embodiment, the first pad electrode 171 is electrically connected to the connecting electrode 160 through the third openings 152a, and the second pad electrode 172 is electrically connected to the metallic layer 140 through the fourth openings 152b. Therefore, an external electric source can supply current to the epitaxial structure 120 through the first and second pad electrodes 171, 172.

Each of the first and second pad electrodes 171, 172 may have a single layer structure or a multilayer structure, and may include a metallic material such as Au, Ti, Ni, Al, Ag, and combinations thereof. Each of the first and second pad electrodes 171, 172 may have a thickness of not less than a few tenths of μm, such as 70 μm to 80 μm. Within such range of thickness, the flip-chip LED may be used in chip-scale package (CSP).

Referring to FIGS. 3 to 10B, a method for preparing the abovementioned flip-chip LED includes the following consecutive steps.

Figure 3:
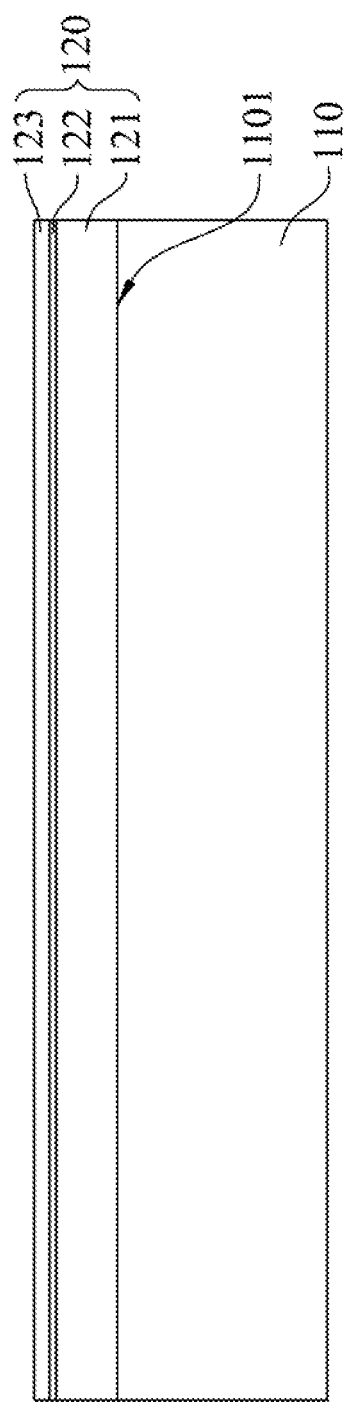

Referring to FIG. 3, the substrate 110 is first provided. The epitaxial structure 120 is then formed on the substrate surface 1101 of the substrate 110 through, for instance, a metal-organic chemical vapor deposition (MOCVD) process, a hydride vapour phase epitaxy (HVPE) process, or a molecular beam epitaxy (MBE) process.

Figure 4A:
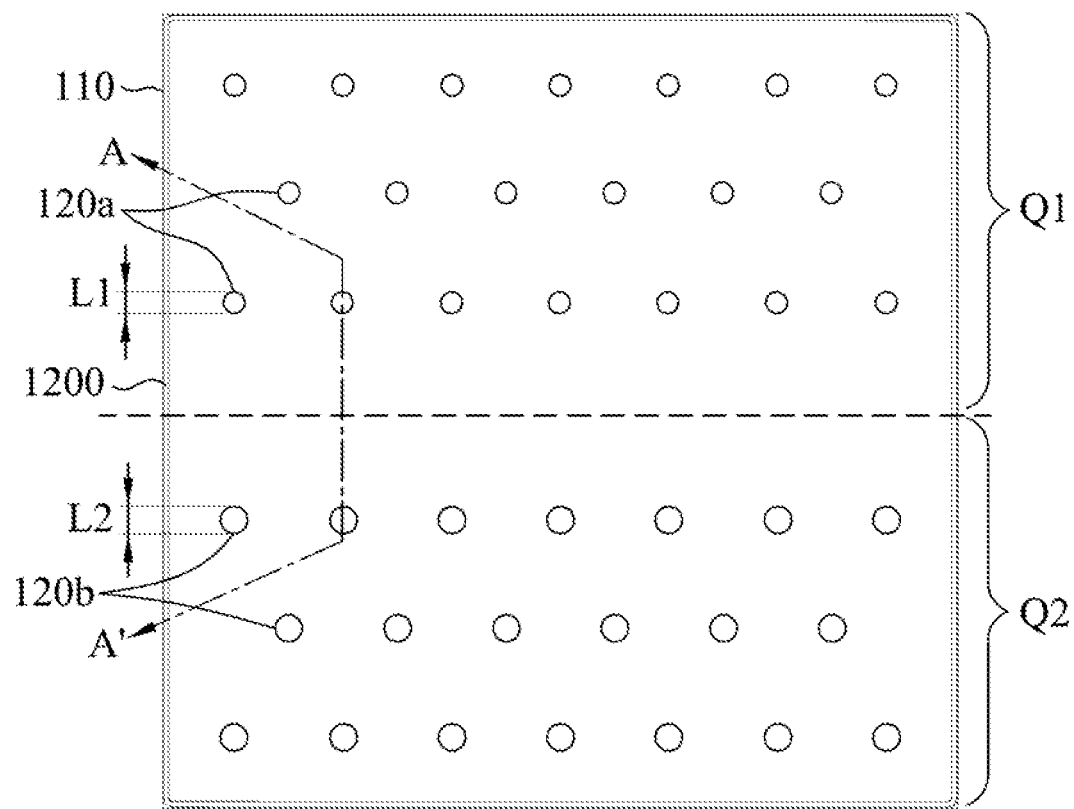
Figure 4B:
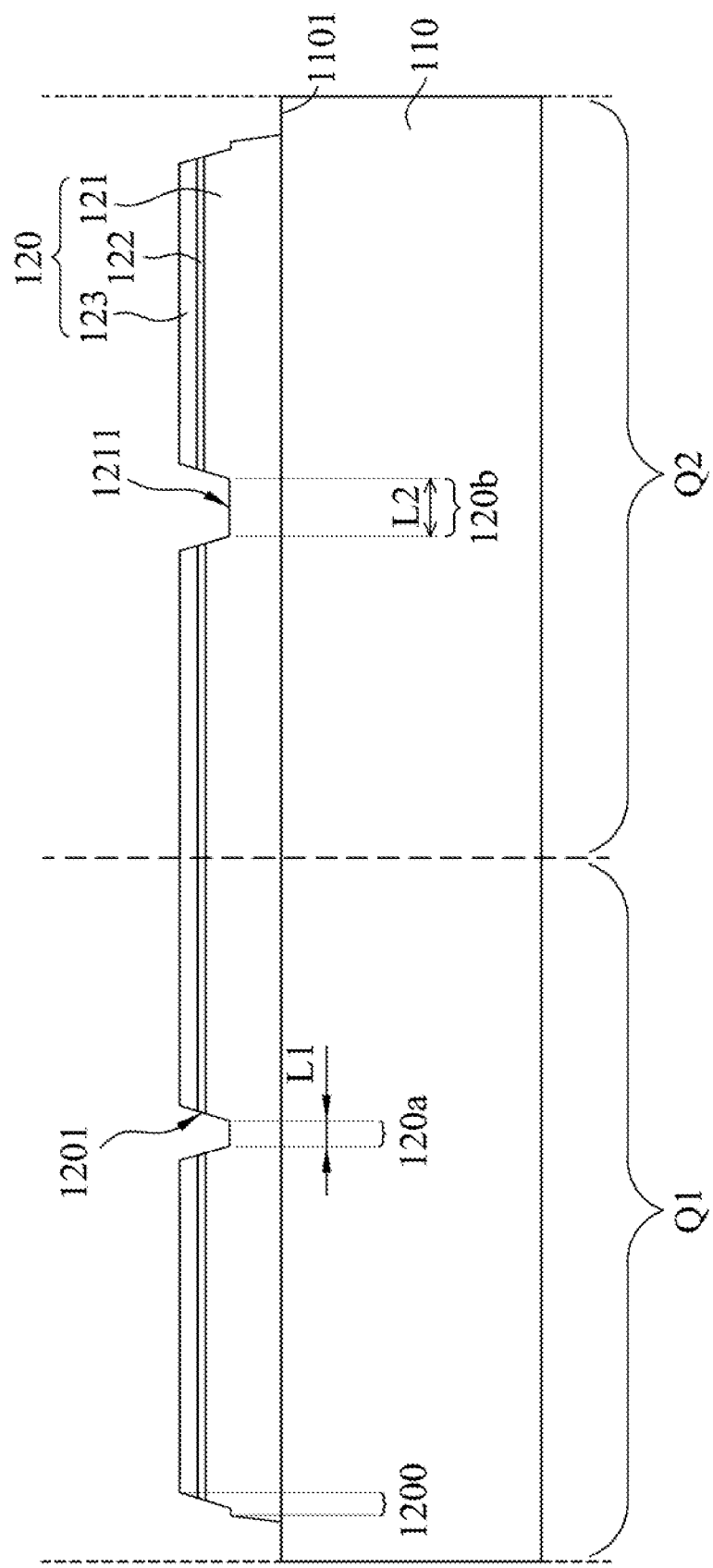

Referring to FIGS. 4A and 4B, the epitaxial structure 120 is then subjected to a patterning process by photolithography or etching, so as to form a mesa structure. Specifically, a portion of the second semiconductor layer 123, a portion of the active layer 122 and a portion of the first semiconductor layer 121 are removed to form a plurality of the first holes 120a at the first region Q1, a plurality of the second holes 120b at the second region Q2, and a surrounding portion 1200 at a periphery of the epitaxial structure 120. According to needs, the surrounding region 1200 may be in a shape of rectangle (see FIG. 4A), or polygon.

Figure 5A:
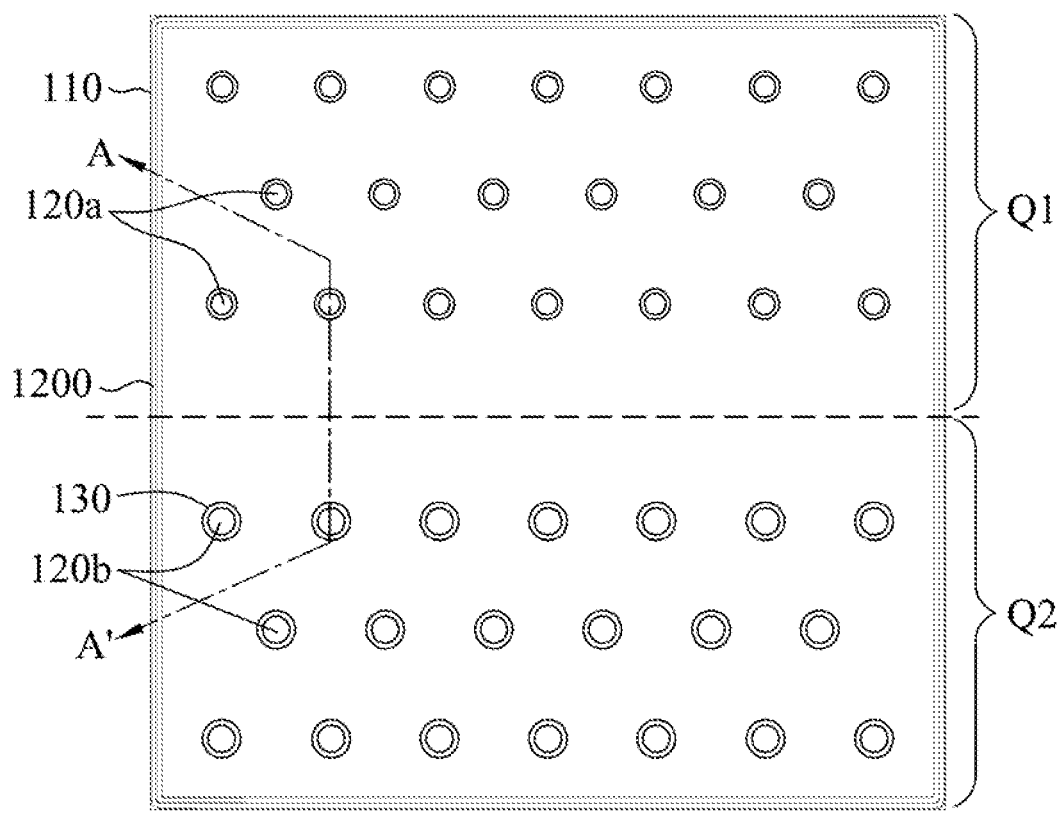
Figure 5B:
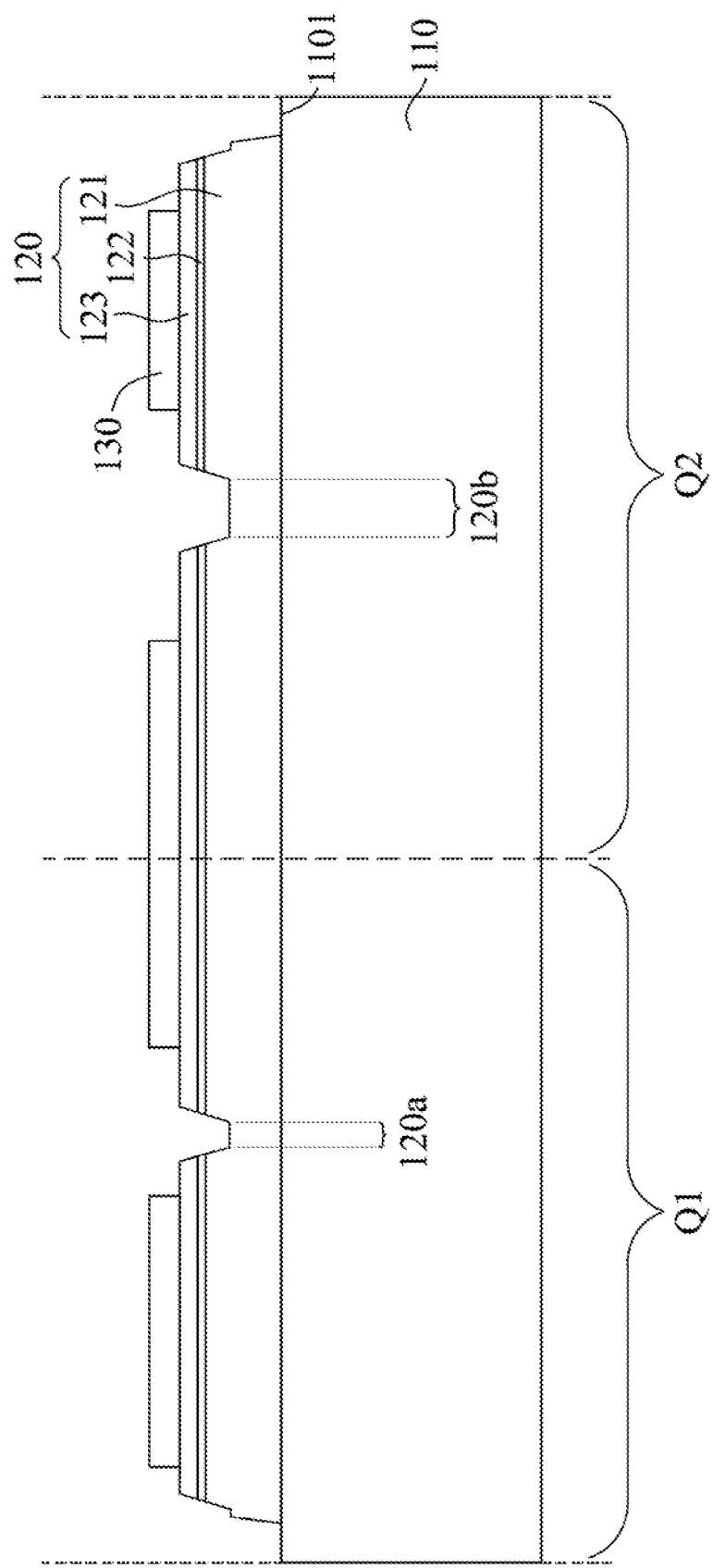

Referring to FIGS. 5A to 5B, the transparent conductive layer 130 is formed on the patterned epitaxial structure 120 by, for instance, a physical deposition process or a chemical deposition process.

Figure 6A:
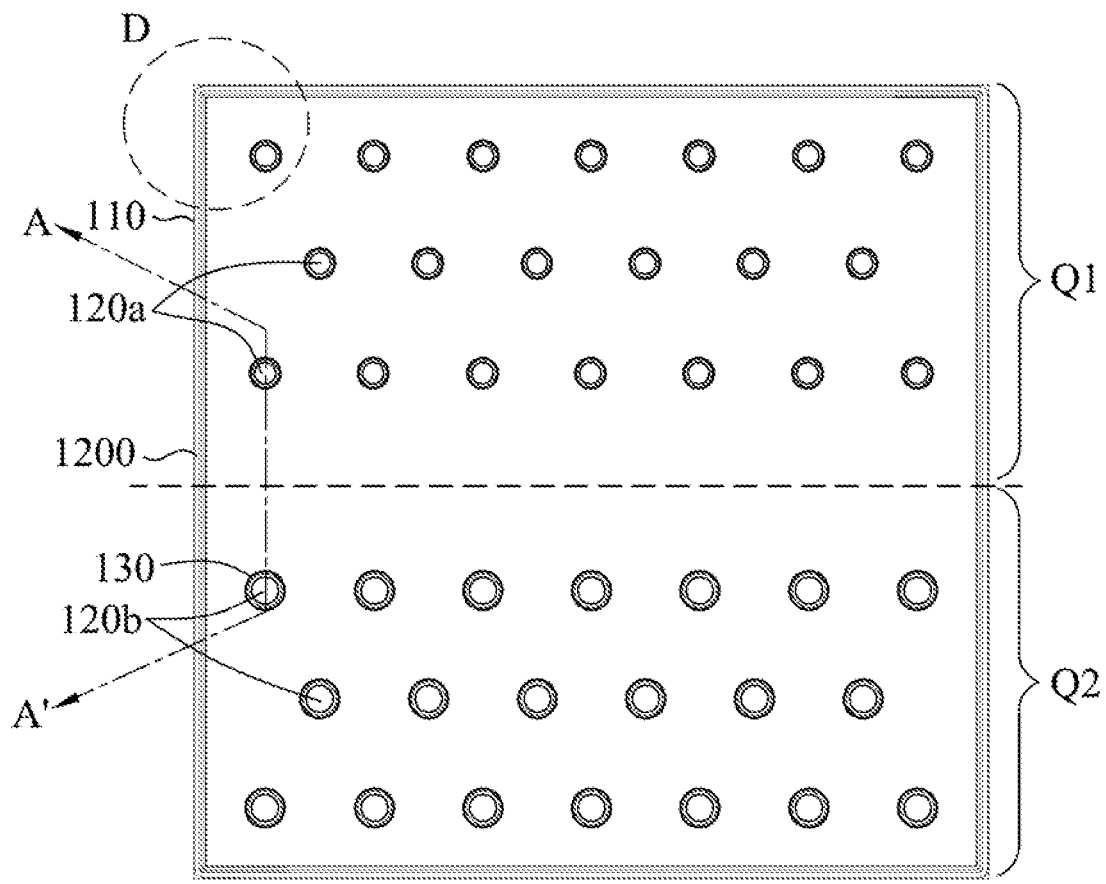
Figure 6B:
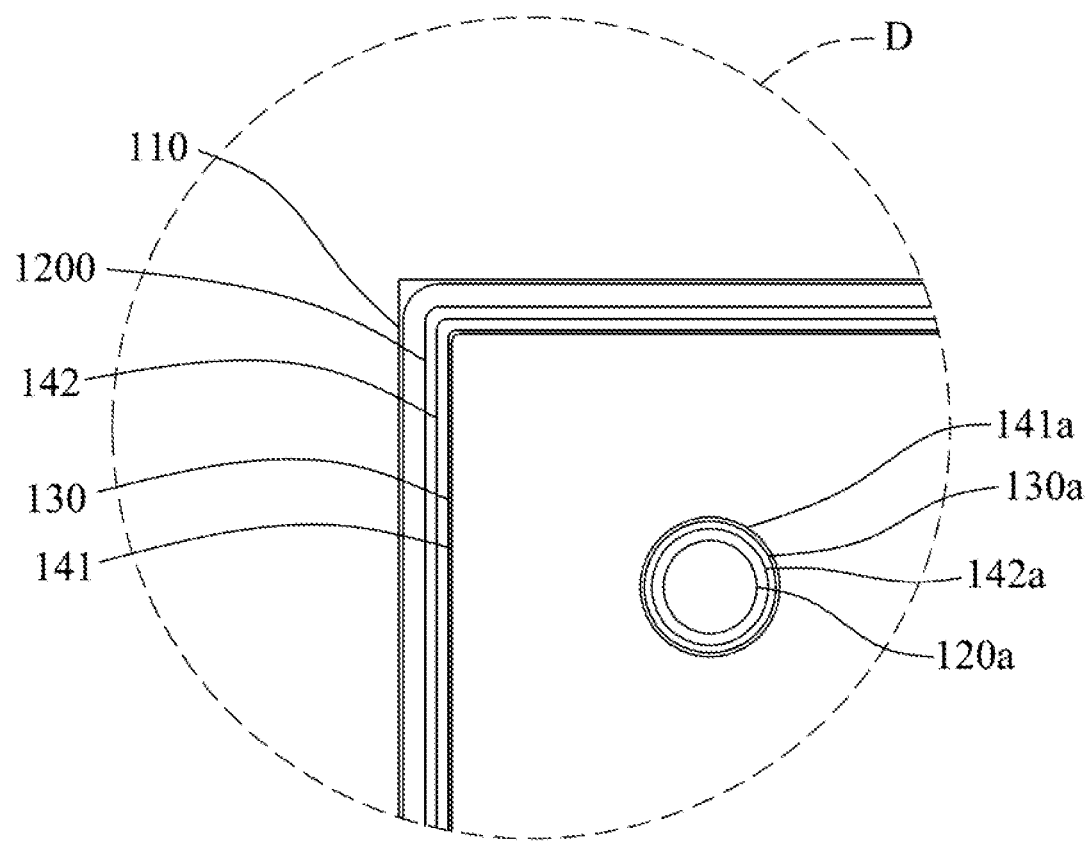
FIGS. 6B and 7B are partially enlarged views of circle regions D and E respectively shown in FIGS. 6A and 7A.
Figure 6C:
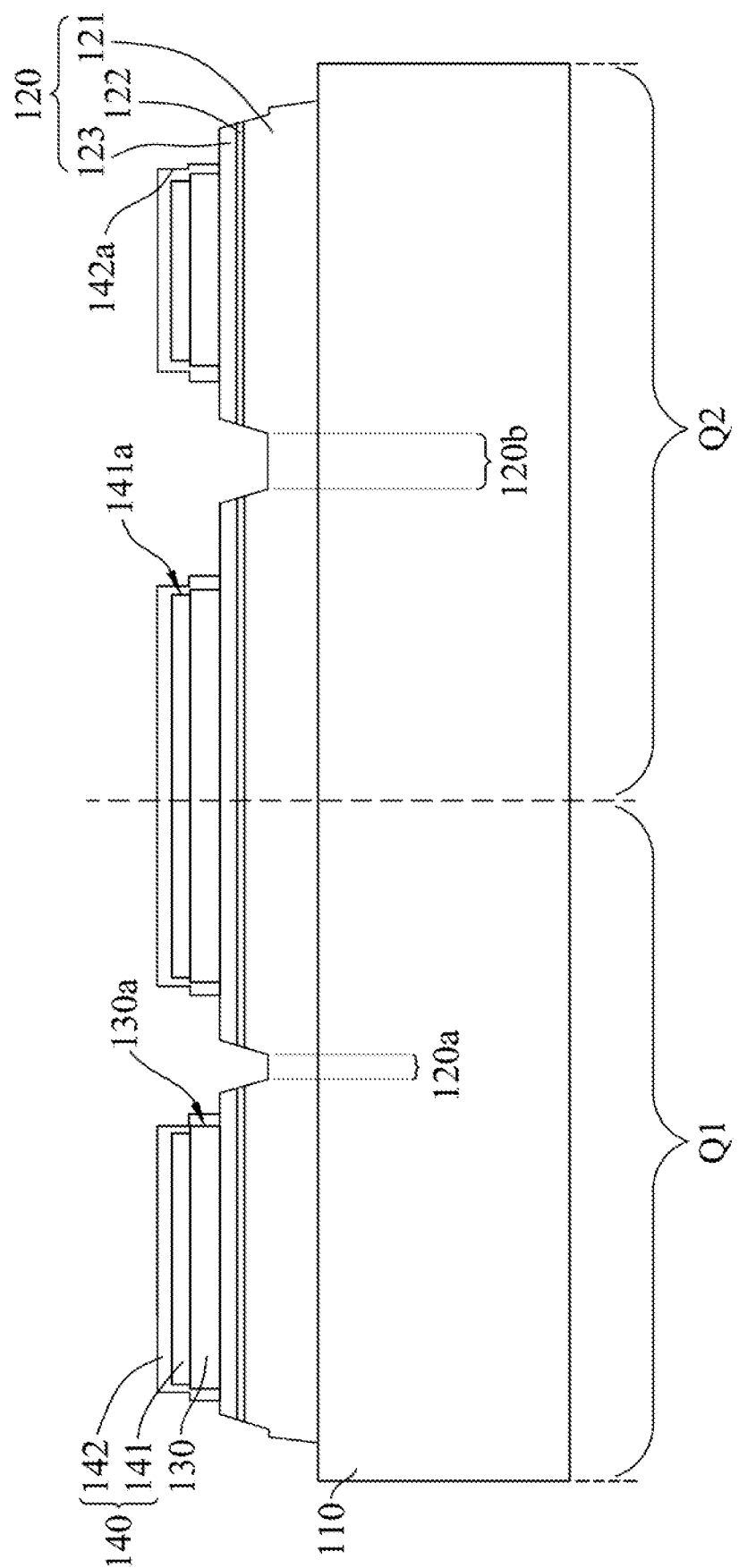

Referring to FIGS. 6A to 6C, the metallic layer 140 is conformally formed on the transparent conductive layer 130 by a physical deposition process or a chemical deposition process. Specifically, the reflecting sublayer 141 is first formed on the transparent conductive layer 130, and then the blocking sublayer 142 are disposed over the reflecting sublayer 141 and the transparent conductive layer 130, so as to form the metallic layer 140.

Figure 7A:
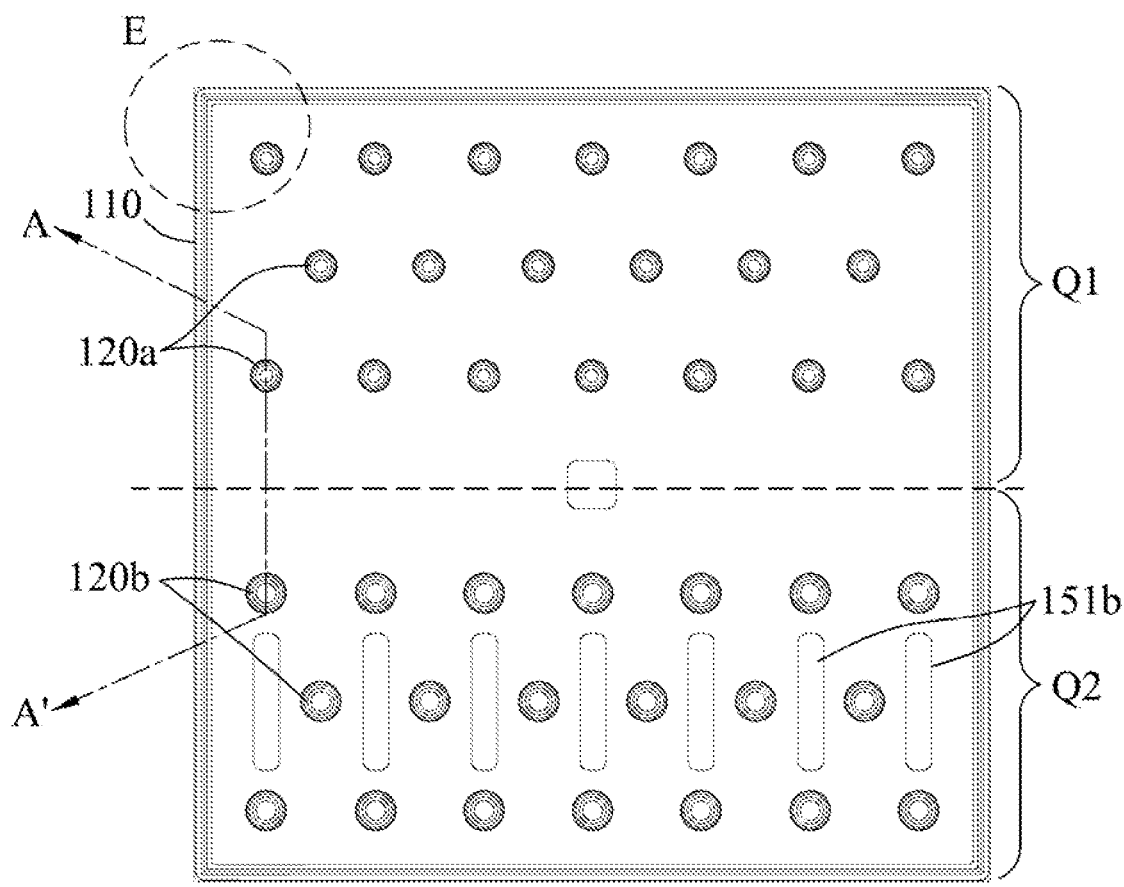
Figure 7B:
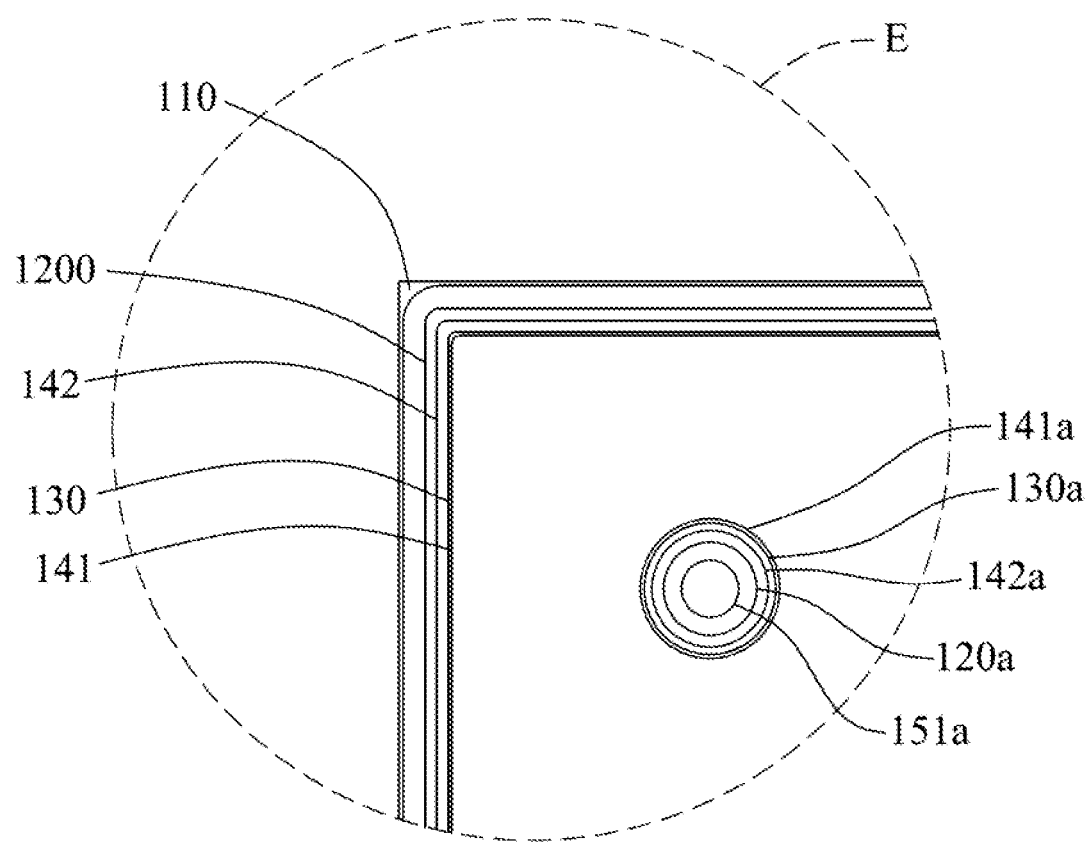
Figure 7C:
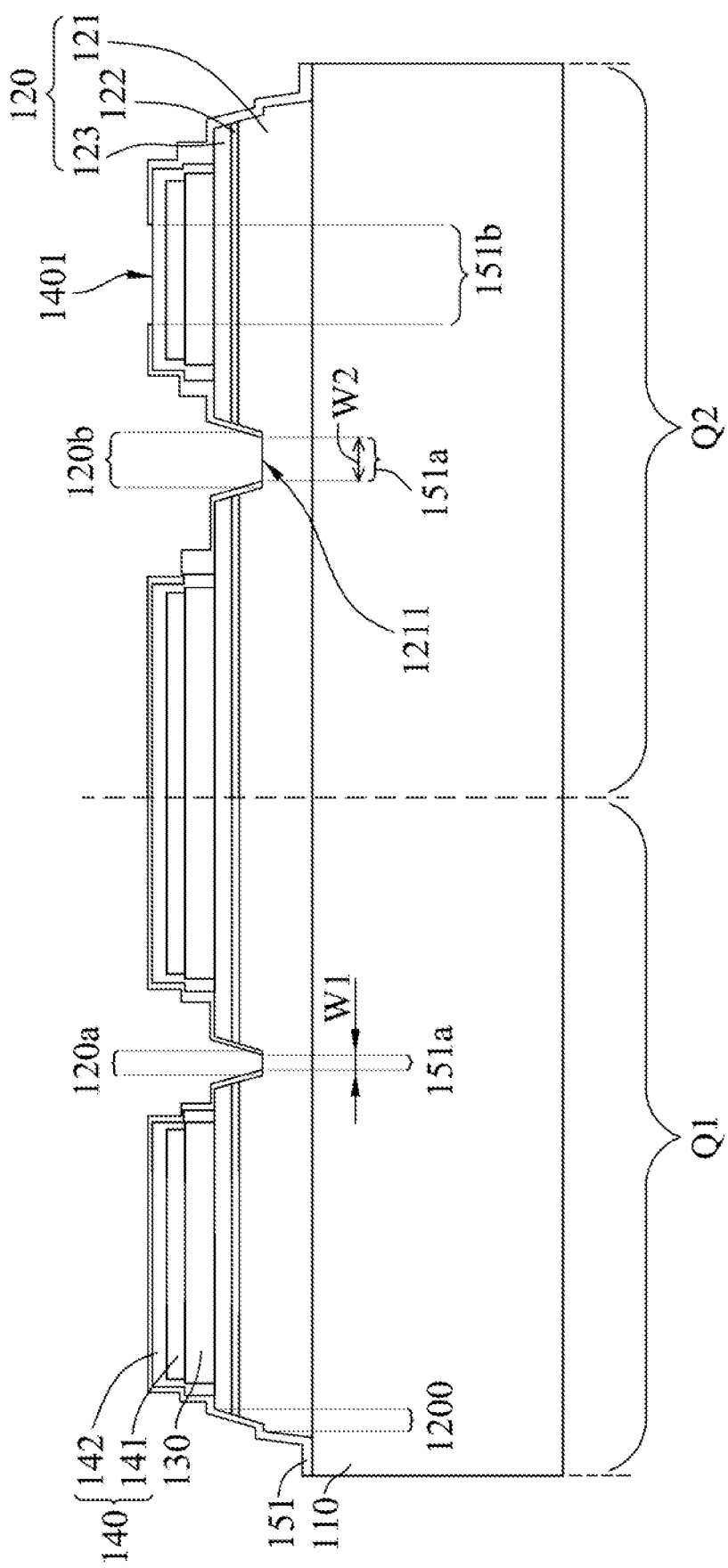

Referring to FIGS. 7A to 7C, the first insulating layer 151 is conformably formed on the metallic layer 140, the epitaxial structure 120 and the substrate 110 by a physical deposition process or a chemical deposition process. Then, the first insulating layer 151 is subjected to a patterning process through a photolithography process or an etching process in such a manner that a plurality of the first openings 151a exposing the surface 1211 of the first semiconductor layer 121 and the second opening 151b exposing the metallic layer 140 are formed.

Figure 8A:
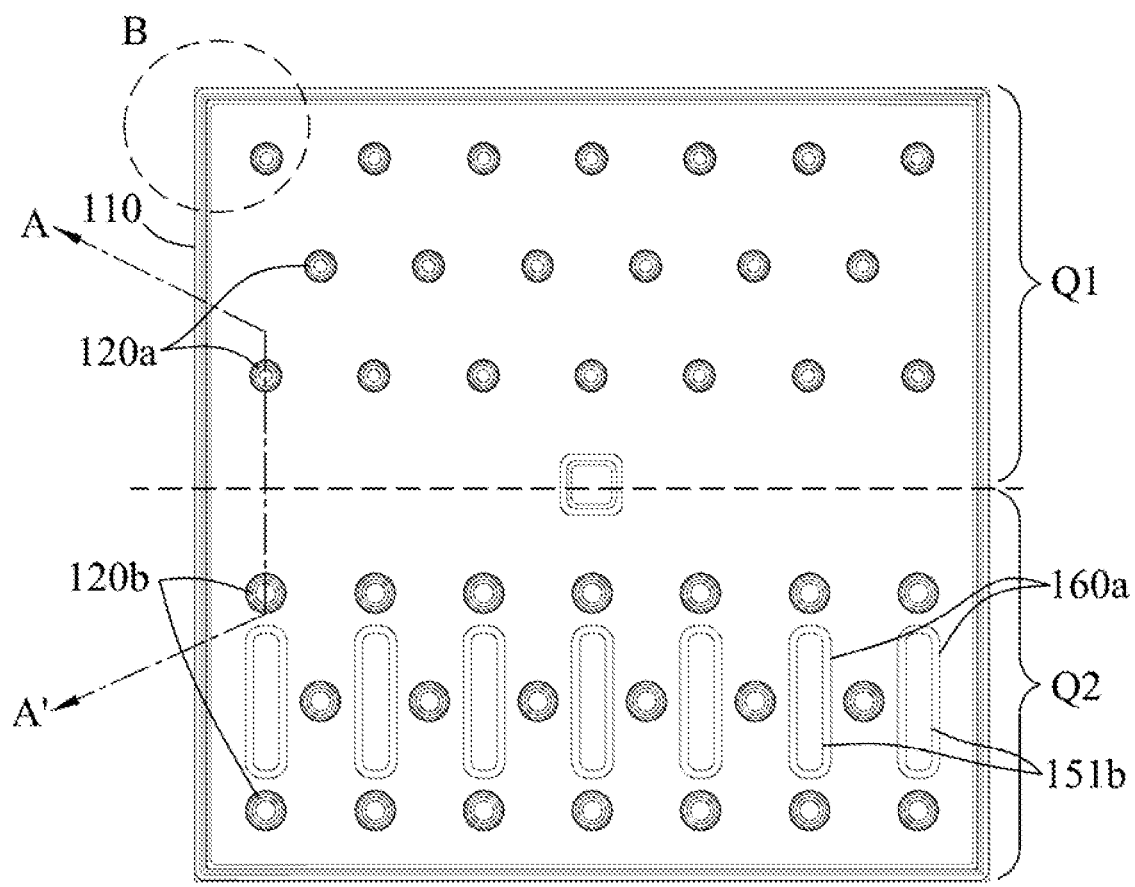
Figure 8B:
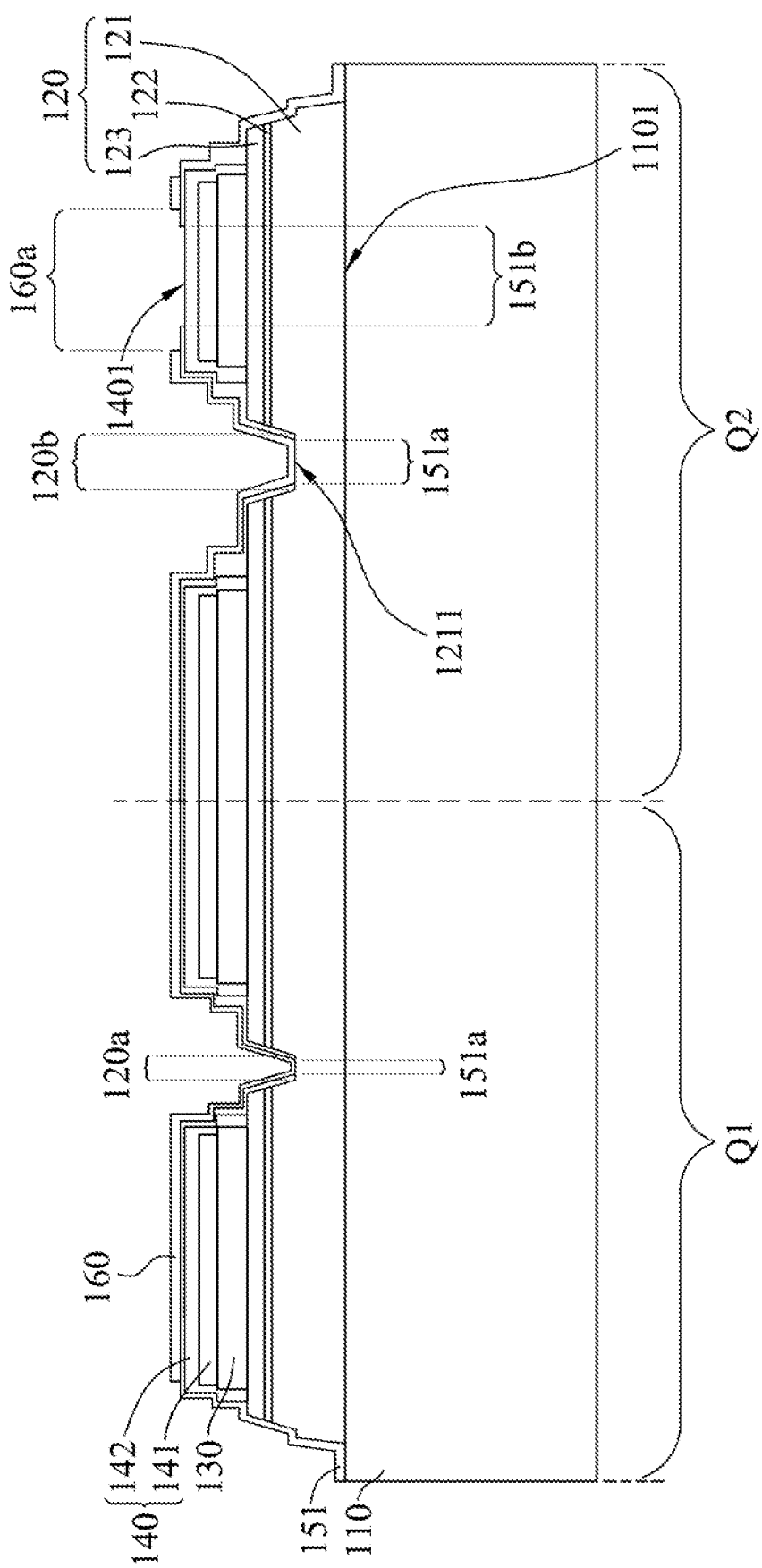

Referring to FIGS. 8A to 8B, the connecting electrode 160 is conformably formed on the first insulating layer 151 and extends into the first openings 151a to cover the exposed surface 1211 of the first semiconductor layer 121 by a physical deposition process or a chemical deposition process. The connecting electrode 160 is then subjected to a patterning process through photolithography or etching to form the electrode opening(s) 160a.

Figure 9A:
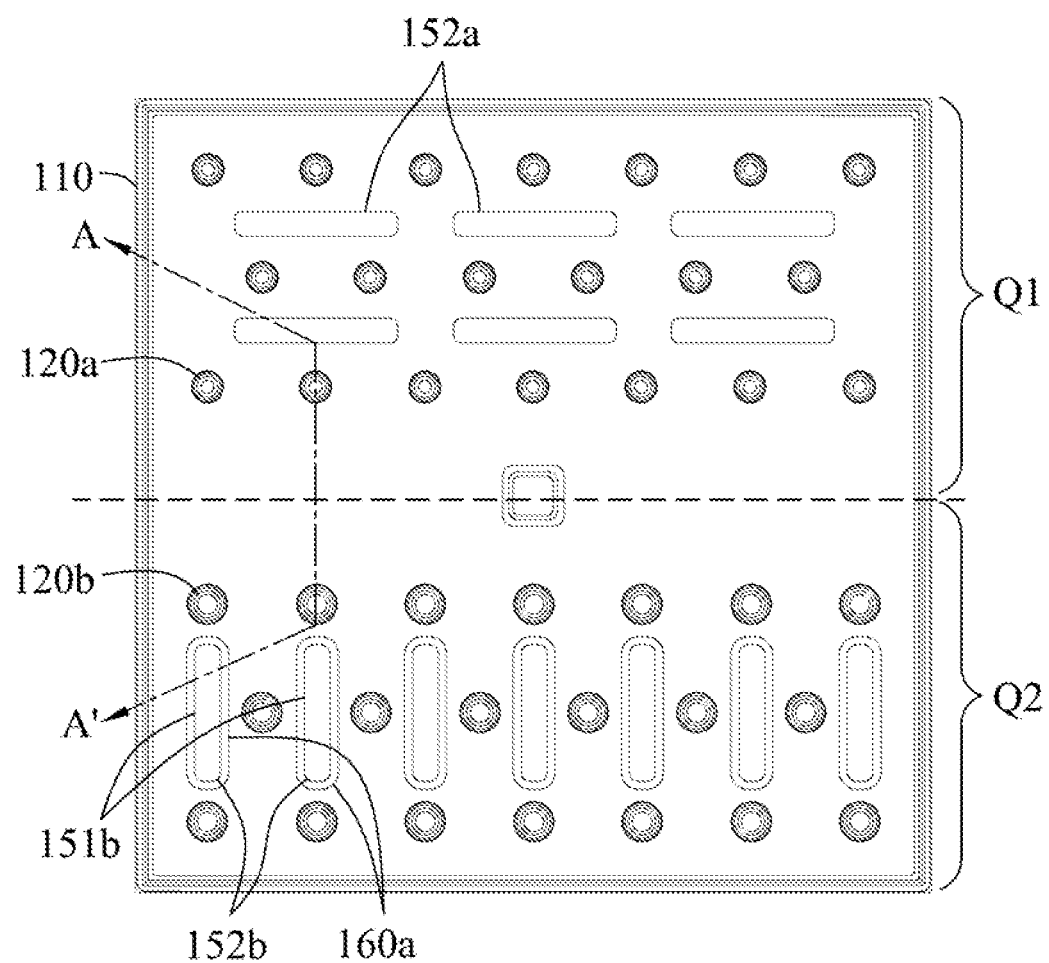
Figure 9B:
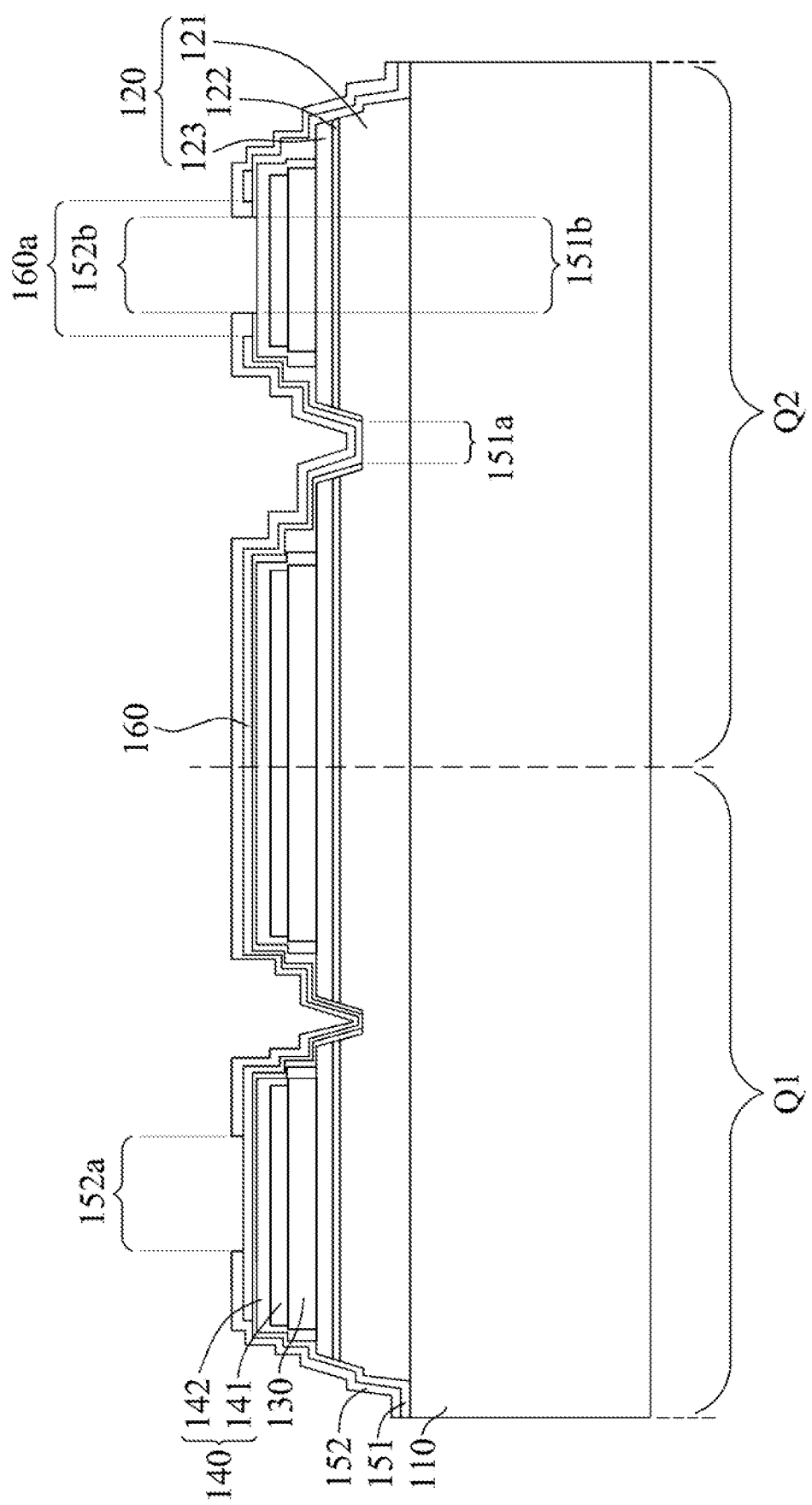

Referring to FIGS. 9A to 9B, the second insulating layer 152 is conformally formed on the connecting electrode 160 by a physical deposition process or a chemical deposition process. Then, the second insulating layer 152 is subjected to a patterning process through photolithography or etching in such a manner that the third opening(s) 152a partially exposing the connecting electrode 160 and the fourth opening(s) 152b partially exposing the metallic layer 140 are formed.

Figure 10A:
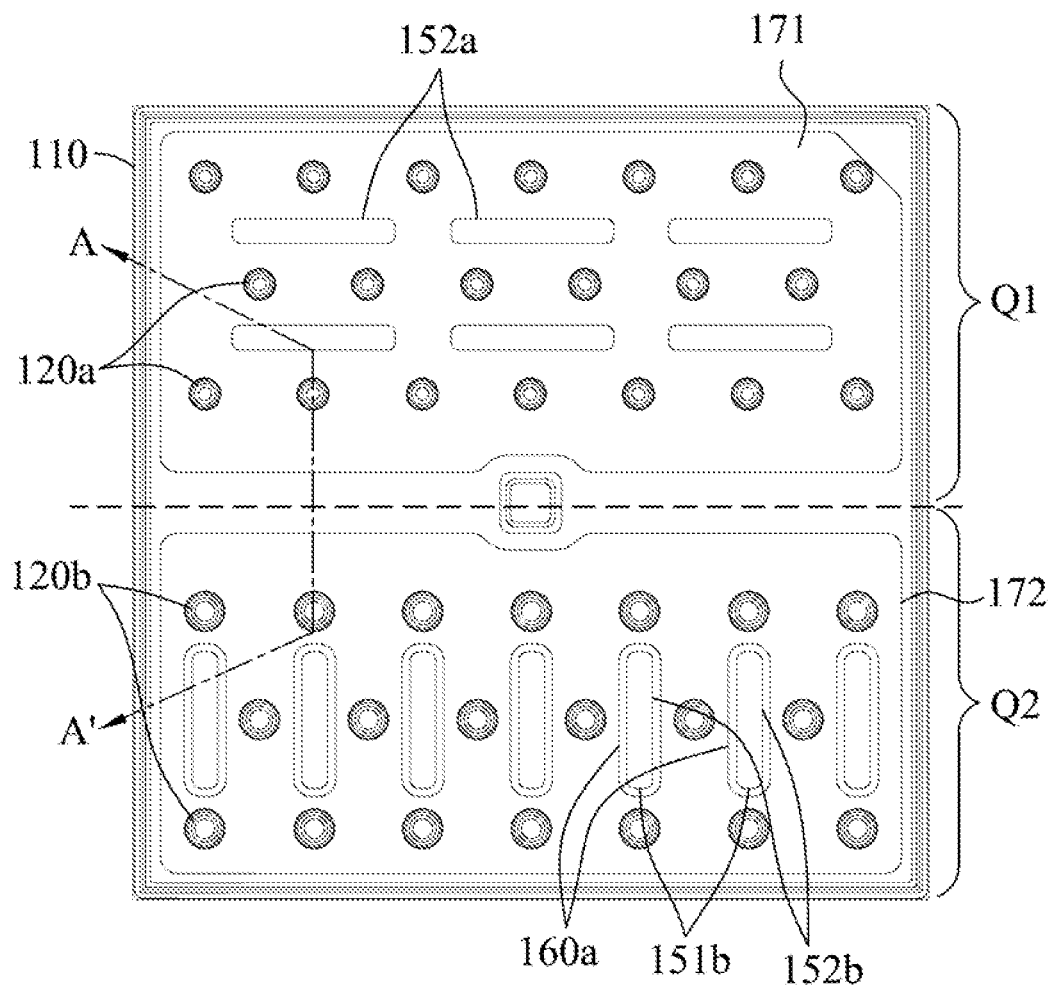
Figure 10B:
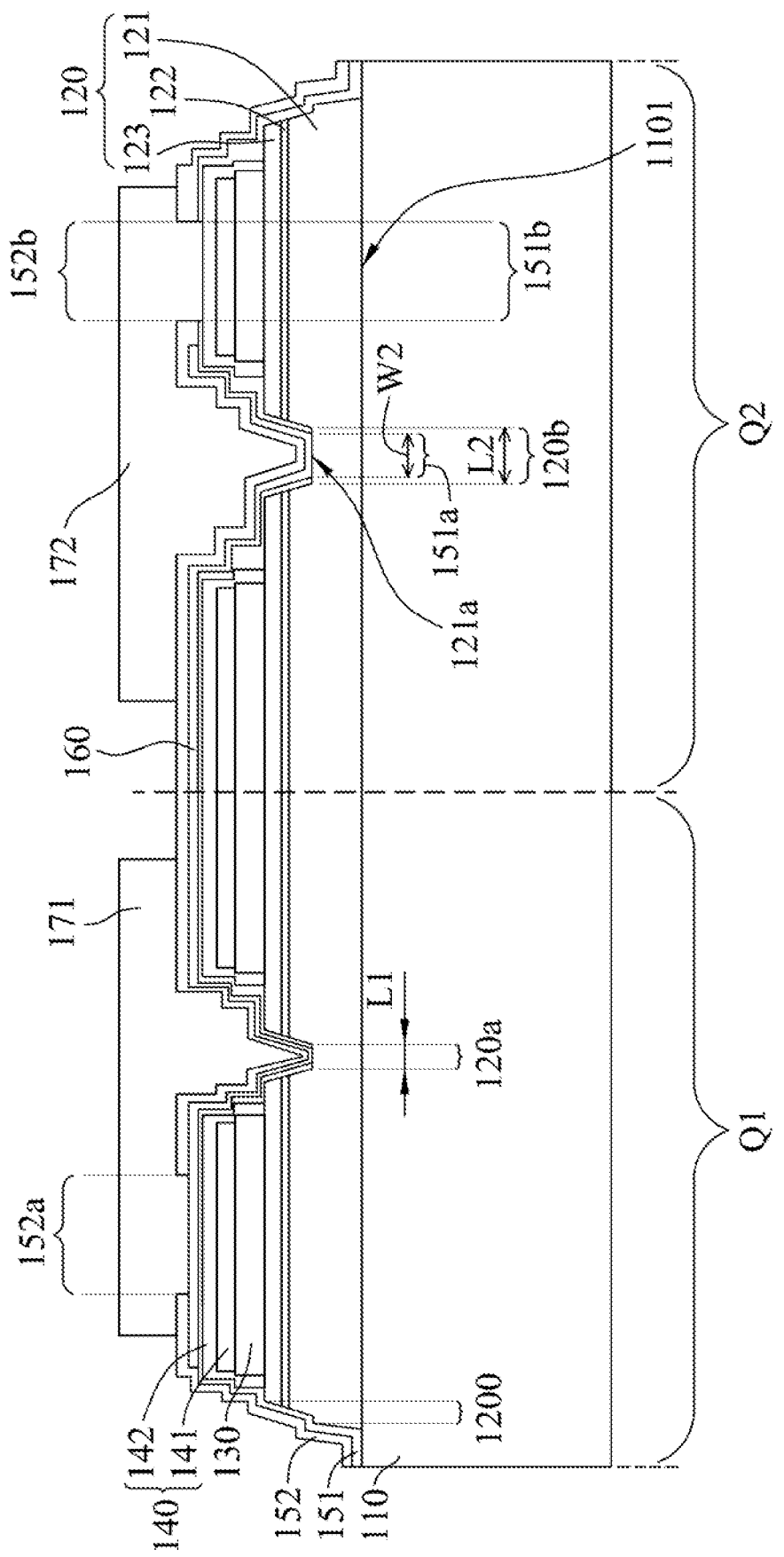

Referring to FIGS. 10A to 10B, the first pad electrode 171 is formed on the epitaxial structure 120 at the first region Q1 to fill the third opening(s) 152a, and the second pad electrode is formed on the epitaxial structure 120 at the second region Q2 to fill the fourth opening(s) 152b. The first and second pad electrodes 171, 172 may be formed by, for instance, an electroplating process, a physical deposition process, or a chemical deposition process.

Figure 11:
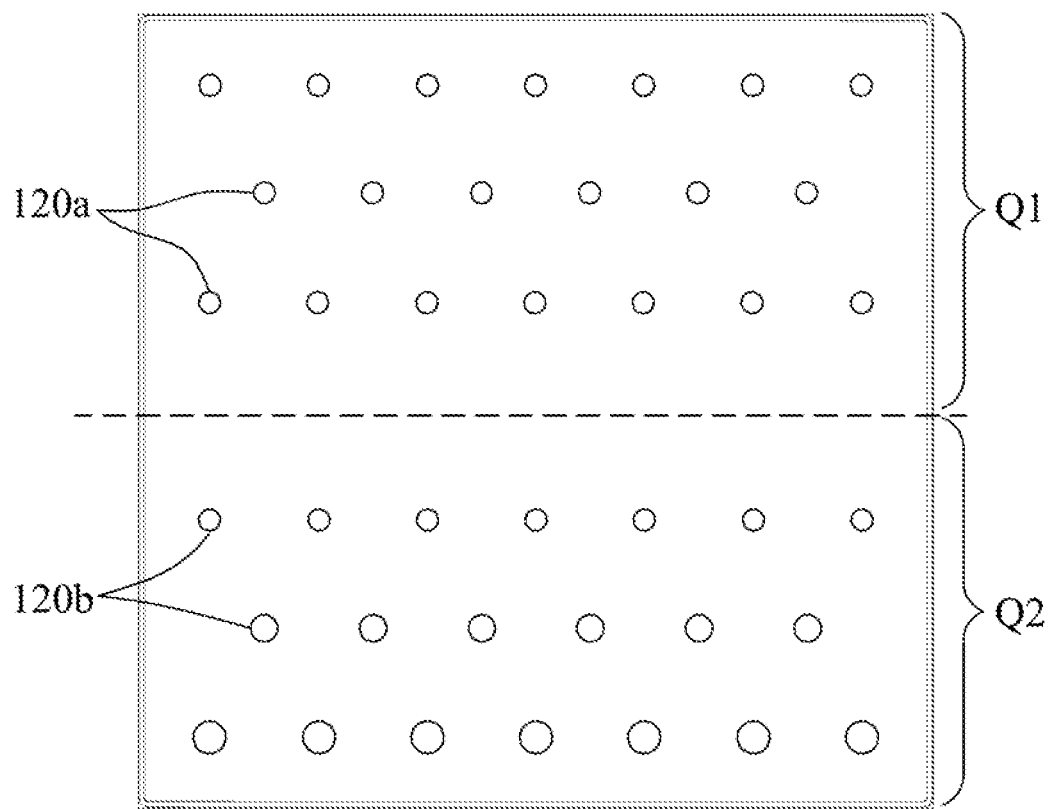
FIG. 11 is a schematic top view illustrating the distribution of first and second holes in a second embodiment of the flip-chip LED according to the disclosure.

Referring to FIG. 11, a second embodiment of the flip-chip LED according to the disclosure is similar to the first embodiment, except that in the second embodiment, the second holes 120b that are distal from the first region Q1 are formed to have a diameter that is larger than a diameter of the second holes 120b that are proximal to the first region Q1. In certain embodiments, the second holes 120b may have a diameter that gradually increase along a direction away from the first region Q1 in a linear manner or in a non-linear manner.

Figure 12:
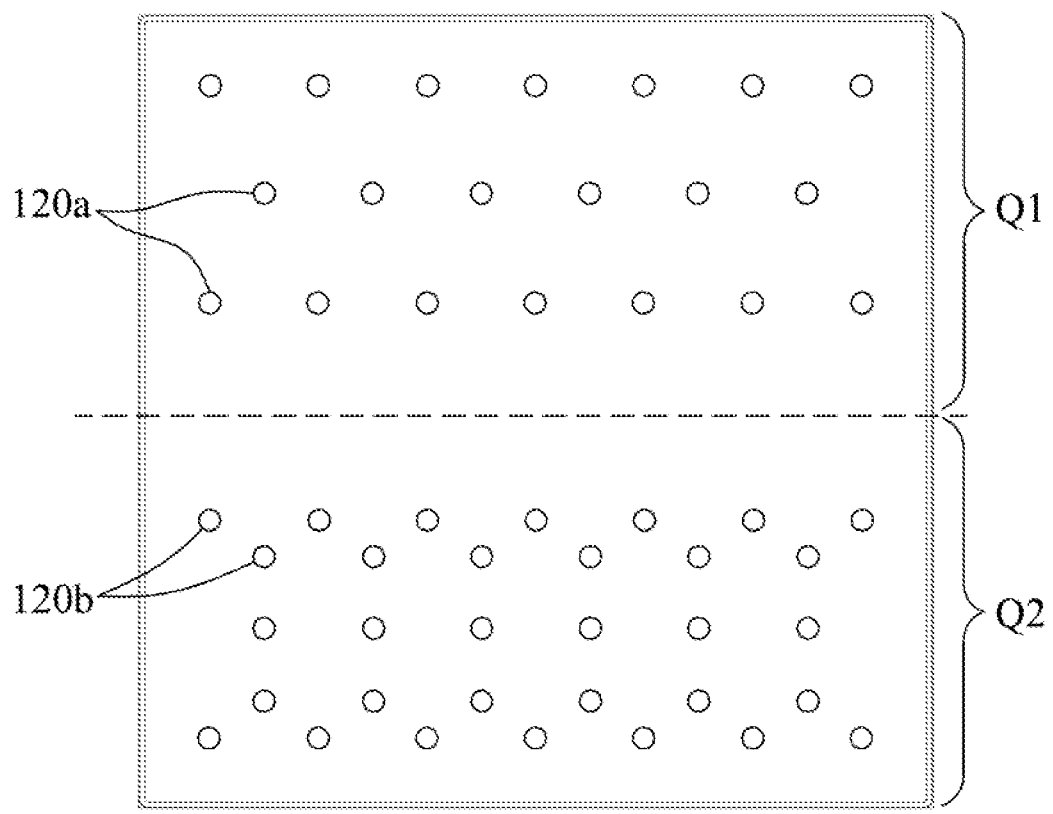
FIG. 12 is a schematic top view illustrating the distribution of the first and second holes in a third embodiment of the flip-chip LED according to the disclosure.

Referring to FIG. 12, a third embodiment of the flip-chip LED according to the disclosure is similar to the first embodiment, except that in the third embodiment, a total amount of the first holes 120a is less than a total amount of the second holes 120b. In certain embodiments, an amount of the first openings 151a located at the first region Q1 is also less than an amount of the first openings 151a located at the second region Q2.

Figure 13:
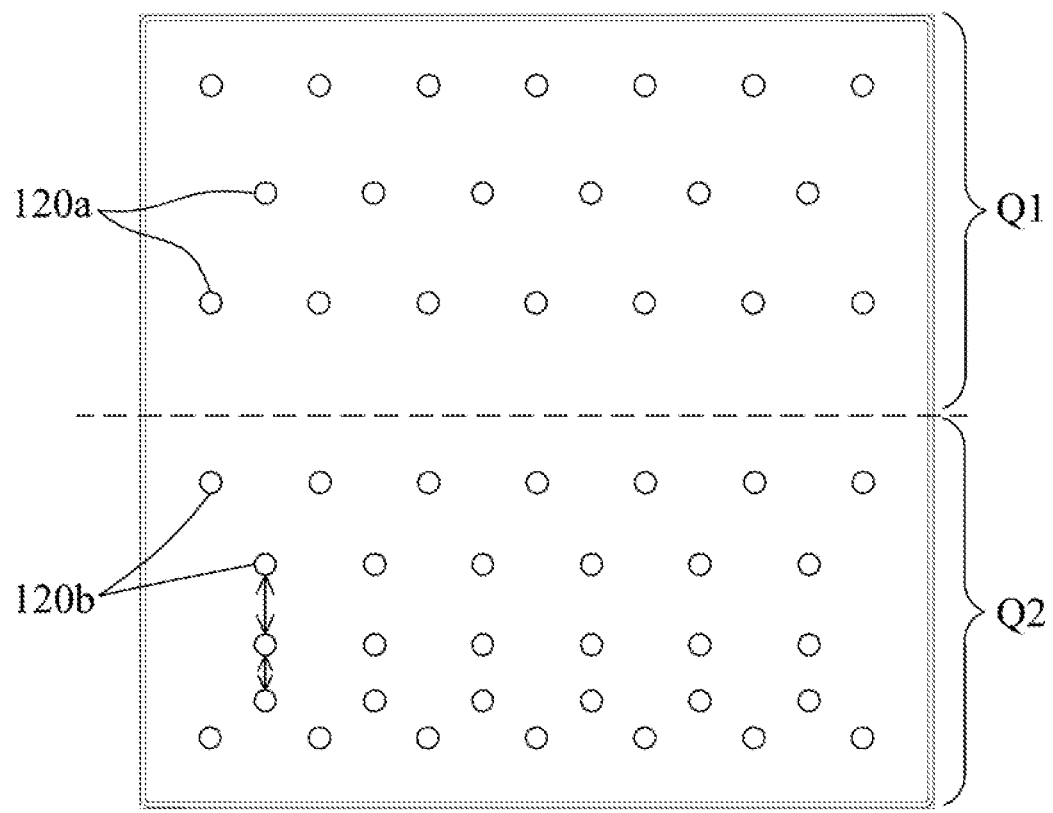
FIG. 13 is a schematic top view illustrating the distribution of the first and second holes in a fourth embodiment of the flip-chip LED according to the disclosure.

Referring to FIG. 13, a fourth embodiment of the flip-chip LED according to the disclosure is similar to the third embodiment, except that in the fourth embodiment, the second holes 120b are spaced apart from one other by a distance that decreases along a direction away from the first region Q1. That is, a distance between every two adjacent ones of the second holes 120b decreases along a direction away from the first region Q1. Such decrease may be in a linear/non-linear or stepwise manner.

Figure 14:
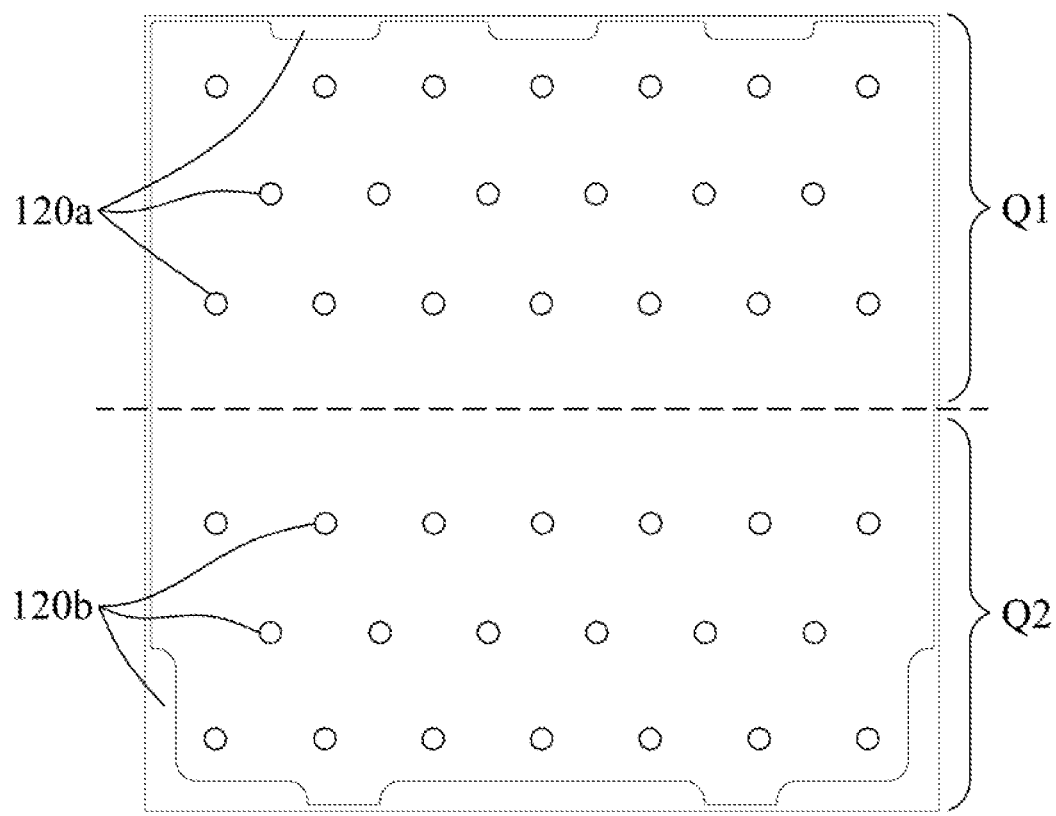
FIG. 14 is a schematic top view illustrating the distribution of the first and second holes in a fifth embodiment of the flip-chip LED according to the disclosure.

Referring to FIG. 14, a fifth embodiment of the flip-chip LED according to the disclosure is similar to the first embodiment, except that in the fifth embodiment, at a center portion of the epitaxial structure 120 other than the surrounding portion 1200, the surface of the first semiconductor layer 121 exposed by the first holes 120a has a total area identical to that exposed by the second holes 120b.

In addition, a portion of the first holes 120a which are in an elongated form are formed at the surrounding portion 1200 of the epitaxial structure 120, and a portion of the second holes 120b which are in an elongated form are formed at the surrounding portion 1200 of the epitaxial structure 120. A surface of the first semiconductor layer 121 exposed by the elongated first holes 120a at the surrounding portion 1200 has an area which is smaller than an area of a surface of the first semiconductor layer 121 exposed by the elongated second holes 120b at the surrounding portion 1200.

Figure 15:
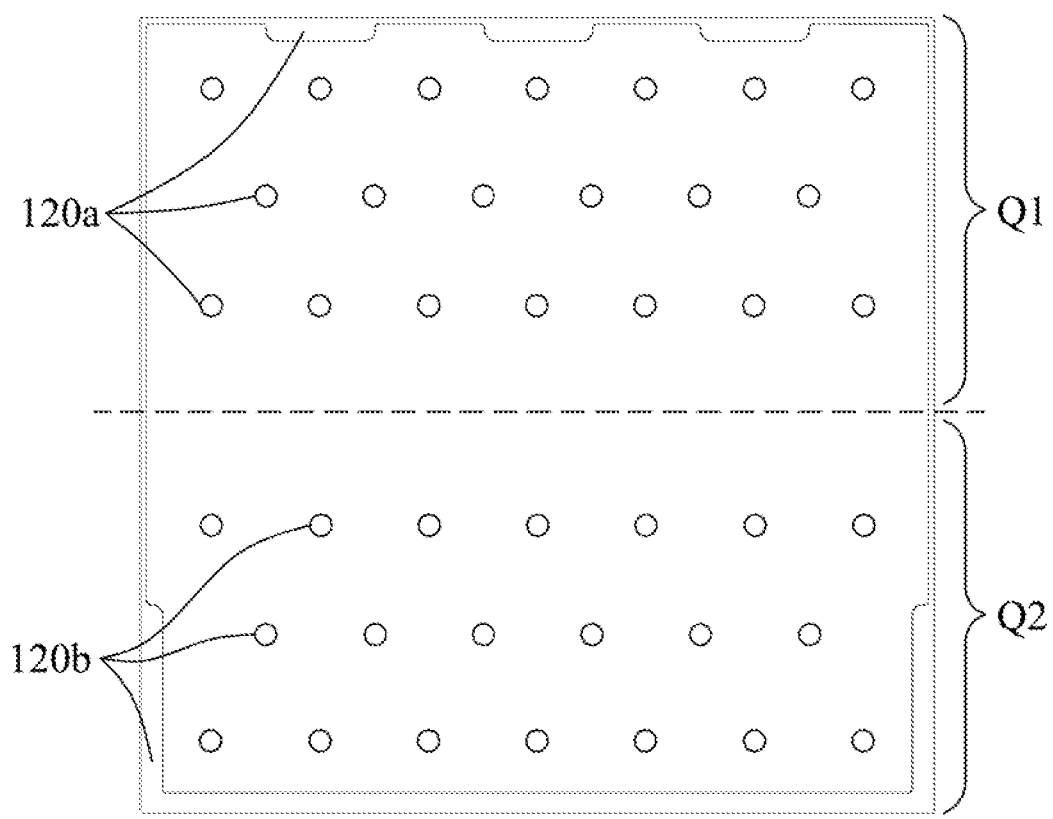
FIG. 15 is a schematic top view illustrating the distribution of the first and second holes in a fifth embodiment of the flip-chip LED according to the disclosure.

Referring to FIG. 15, a sixth embodiment of the flip-chip LED according to the disclosure is similar to the fifth embodiment, except that in the sixth embodiment, the elongated second holes 120b at the surrounding portion 1200 are spatially connected to one other.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A flip-chip light-emitting diode (LED), comprising:
  an epitaxial structure which includes a first semiconductor layer, an active layer and a second semiconductor layer that are sequentially disposed on one another in such order, said epitaxial structure having a first region and a second region that are independent from each other, wherein said epitaxial structure is formed with a plurality of first holes at said first region and a plurality of second holes at said second region, each of said first and second holes extending through said second semiconductor layer and said active layer and terminating at and partially exposing said first semiconductor layer;

a first pad electrode which is disposed on said first region and which is electrically connected to said first semiconductor layer; and a second pad electrode which is disposed on said second region and which is electrically connected to said second semiconductor layer, wherein a surface of said first semiconductor layer exposed by said first holes has a total area which is smaller than a total area of a surface of said first semiconductor layer exposed by said second holes.

2. The flip-chip LED of claim 1, wherein a diameter of said first holes adjacent to said first semiconductor layer is smaller than a diameter of said second holes adjacent to said first semiconductor layer.

3. The flip-chip LED of claim 1, wherein said second holes that are distal from said first region have a diameter larger than a diameter of said second holes that are proximal to said first region.

4. The flip-chip LED of claim 1, wherein a total amount of said first holes is less than a total amount of said second holes.

5. The flip-chip LED of claim 1, wherein said second holes are spaced apart from each other by a distance that decreases along a direction away from said first region.

6. The flip-chip LED of claim 1, further comprising a metallic layer which is disposed on said epitaxial structure, said first and second pad electrodes disposed on said metallic layer being opposite to said epitaxial structure.

7. The flip-chip LED of claim 6, wherein said metallic layer includes a metallic material having a reflectance greater than 60%.

8. The flip-chip LED of claim 6, further comprising a first insulating layer which is conformally disposed on said epitaxial structure and said metallic layer, and which is formed with a plurality of first openings that partially expose said first semiconductor layer and at least one second opening that partially exposes said metallic layer at said second region, each of said first openings partially overlaps with a corresponding one of said first and second holes.

9. The flip-chip LED of claim 8, wherein each of said first openings is located within the corresponding one of said first and second holes.

10. The flip-chip LED of claim 8, wherein said first openings located at said first region have a width that is smaller than a width of said first openings located at said second region.

11. The flip-chip LED of claim 8, wherein an amount of said first openings located at said first region is less than an amount of said first openings located at said second region.

12. The flip-chip LED of claim 8, further comprising a connecting electrode which is conformally disposed on said first insulating layer and which extends into said first openings to electrically contact with said first semiconductor layer, and which is electrically insulated from said second semiconductor layer through said first insulating layer.

13. The flip-chip LED of claim 12, wherein a contact area between said connecting electrode and said first semiconductor layer located at said first region is smaller than a contact area between said connecting electrode and said first semiconductor layer located at said second region.

14. The flip-chip LED of claim 12, further comprising a second insulating layer which is disposed over said connecting electrode, and which is formed with at least one third opening that partially exposes said connecting electrode, and at least one fourth opening that partially exposes said metallic layer.

15. The flip-chip LED of claim 14, wherein said third opening is located at the first region, and said fourth opening is located at said second region.

16. The flip-chip LED of claim 14, wherein said first pad electrode is electrically connected to said connecting electrode through said third opening, and said second pad electrode is electrically connected to said metallic layer through said fourth opening.

17. The flip-chip LED of claim 14, wherein said second opening partially overlaps with said fourth opening.

18. The flip-chip LED of claim 1, wherein a portion of said first holes and a portion of said second holes are formed at a surrounding portion of said epitaxial structure, a surface of said first semiconductor layer exposed by said first holes at said surrounding portion having an area which is smaller than an area of a surface of said first semiconductor layer exposed by said second holes at said surrounding portion.

19. A flip-chip LED comprising:

an epitaxial structure which includes a first semiconductor layer, an active layer and a second semiconductor layer that are sequentially disposed on one another in such order, said epitaxial structure having a first region and a second region that are independent from each other;

a first insulating layer which is disposed on said epitaxial structure, and which has a plurality of first openings that expose a portion of said first semiconductor layer at said first and second regions;

a connecting electrode which is disposed on said first insulating layer and within said first openings, and which is electrically connected to said first semiconductor layer through said first opening;

a first pad electrode which is disposed on said first region and which is electrically connected to said first semiconductor layer through said connecting electrode; and a second pad electrode which is disposed on said second region and which is electrically connected to said second semiconductor layer, wherein a contact area between said connecting electrode and said first semiconductor layer located at said first region is smaller than a contact area between said connecting electrode and said first semiconductor layer located at said second region.

20. The flip-chip LED of claim 19, wherein said epitaxial structure is formed with a plurality of first holes at said first region and a plurality of second holes at said second region, each of said first and second holes extending through said second semiconductor layer and said active layer and partially exposing said first semiconductor layer, each of said first openings overlapping with a corresponding one of said first and second holes.

* * * * *